United States Patent
Yasuda et al.

(10) Patent No.: US 8,497,732 B2
(45) Date of Patent: Jul. 30, 2013

(54) THREE-DIMENSIONAL SEMICONDUCTOR INTEGRATED CIRCUIT

(75) Inventors: Shinichi Yasuda, Kawasaki (JP); Keiko Abe, Yokohama (JP); Shinobu Fujita, Inagi (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 0 days.

(21) Appl. No.: 13/223,898

(22) Filed: Sep. 1, 2011

(65) Prior Publication Data

US 2011/0309881 A1    Dec. 22, 2011

Related U.S. Application Data

(63) Continuation of application No. PCT/JP2010/054934, filed on Mar. 23, 2010.

(30) Foreign Application Priority Data

Mar. 25, 2009    (JP) ................................ 2009-073896

(51) Int. Cl.
    *H01L 25/00*    (2006.01)
(52) U.S. Cl.
    USPC ............ 327/565; 257/777; 257/774; 257/698
(58) Field of Classification Search
    USPC ........................... 327/565; 257/777, 774, 698
    See application file for complete search history.

(56) References Cited

U.S. PATENT DOCUMENTS

| | | | |
|---|---|---|---|
| 6,589,180 B2 * | 7/2003 | Erikson et al. | 600/459 |
| 6,853,085 B2 * | 2/2005 | Kux et al. | 257/777 |
| 7,821,108 B2 * | 10/2010 | Hollis | 257/621 |
| 7,949,984 B2 | 5/2011 | Tanamoto et al. | 716/124 |
| 8,238,134 B2 * | 8/2012 | Matsui et al. | 365/63 |
| 2006/0001176 A1 * | 1/2006 | Fukaishi et al. | 257/777 |

(Continued)

FOREIGN PATENT DOCUMENTS

| | | |
|---|---|---|
| JP | 2001-77870 | 3/2001 |
| JP | 2001-156621 | 6/2001 |
| JP | 2006-148389 | 6/2006 |
| WO | WO 2008/111409 A1 | 9/2008 |

OTHER PUBLICATIONS

International Search Report and Written Opinion dated Jun. 22, 2010 from PCT/JP2010/054934.

(Continued)

*Primary Examiner* — Ryan Jager
(74) *Attorney, Agent, or Firm* — Ohlandt, Greeley, Ruggiero & Perle, L.L.P.

(57) ABSTRACT

According to one embodiment, a three-dimensional semiconductor integrated circuit includes first, second and third chips which are stacked, and a common conductor which connects the first, second and third chips from one another. The first chip includes a first multi-leveling circuit, the second chip includes a second multi-leveling circuit, and the third chip includes a decoding circuit. The first multi-leveling circuit includes a first inverter to which binary first data is input and which outputs one of first and second potentials and a first capacitor which is connected between an output terminal of the first inverter and the common conductor. The second multi-leveling circuit includes a second inverter to which binary second data is input and which outputs one of third and fourth potentials and a second capacitor which is connected between an output terminal of the second inverter and the common conductor.

9 Claims, 22 Drawing Sheets

U.S. PATENT DOCUMENTS

2007/0029646 A1* 2/2007 Voldman .................. 257/662
2010/0072614 A1 3/2010 Fujita ..................... 257/734
2011/0140286 A1* 6/2011 Machida .................. 257/777
2011/0266683 A1* 11/2011 Feng ..................... 257/773

OTHER PUBLICATIONS

Zerbe, et al., "*1.6 Gb/s/pin 4-PAM Signaling and Circuits for a Multi-Drop Bus*";Symposium on VLSI Circuits Digest of Technical Papers, 2000, pp. 128-131.

* cited by examiner

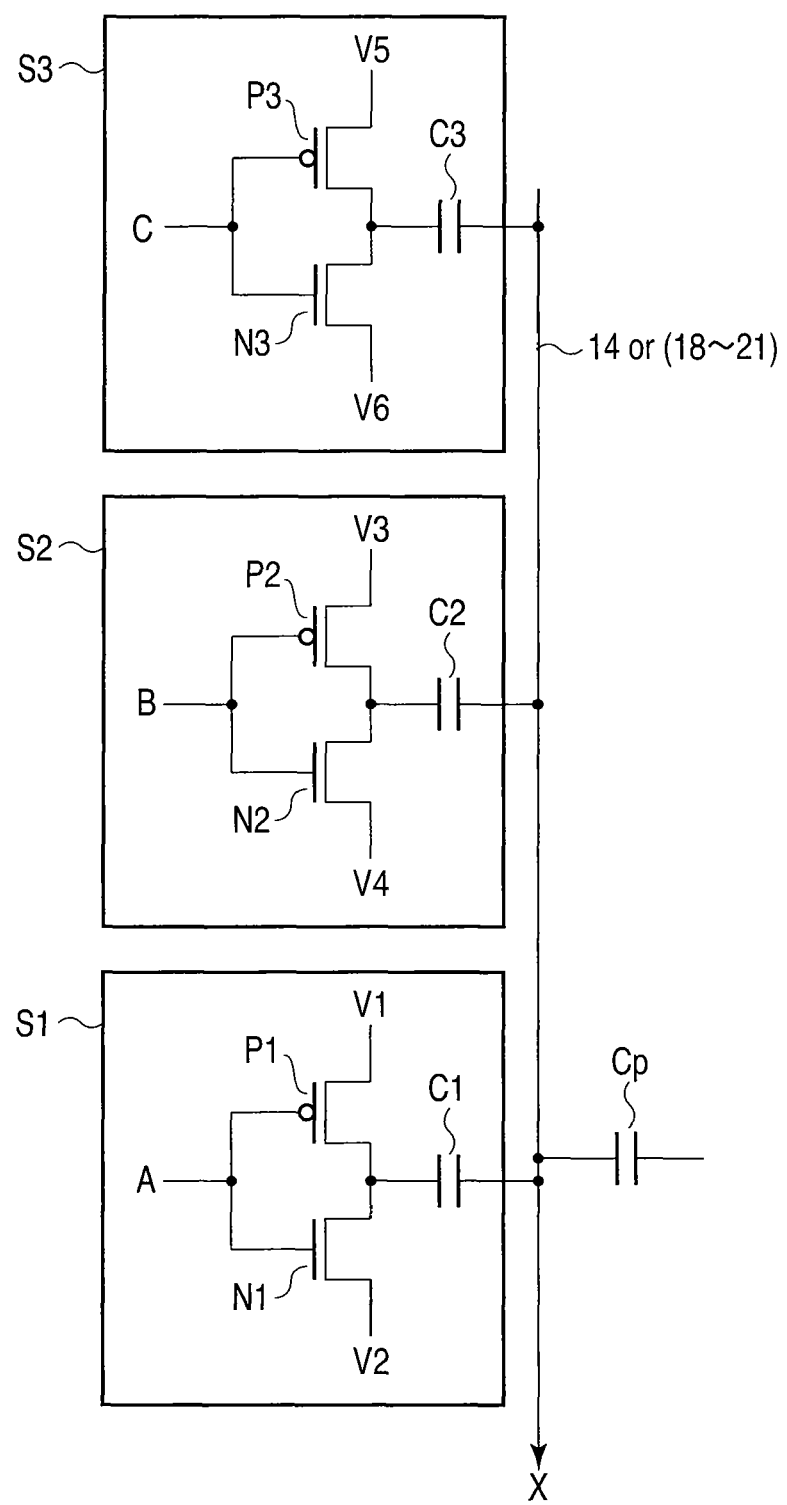
F I G. 5

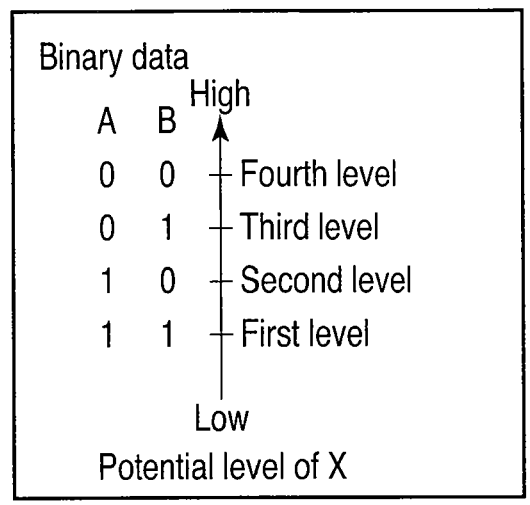
F I G. 9
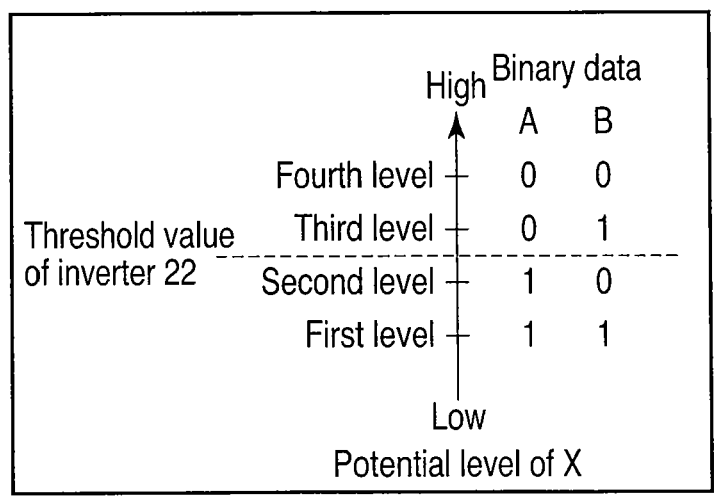
F I G. 10

```
Binary data
          High
 A B C    ▲
 0 0 0  ─┼─ Eighth level
 0 0 1  ─┼─ Seventh level
 0 1 0  ─┼─ Sixth level
 0 1 1  ─┼─ Fifth level
 1 0 0  ─┼─ Fourth level
 1 0 1  ─┼─ Third level
 1 1 0  ─┼─ Second level
 1 1 1  ─┼─ First level
          Low
   Potential level of X
```

FIG. 13

```
                                Binary data
                           High
                            ▲  A B C
           Eighth level ─┼─ 0 0 0
          Seventh level ─┼─ 0 0 1
            Sixth level ─┼─ 0 1 0
Threshold value  Fifth level ─┼─ 0 1 1
of inverter 22  Fourth level ─┼─ 1 0 0
            Third level ─┼─ 1 0 1
           Second level ─┼─ 1 1 0
            First level ─┼─ 1 1 1
                           Low
                    Potential level of X
```

FIG. 14

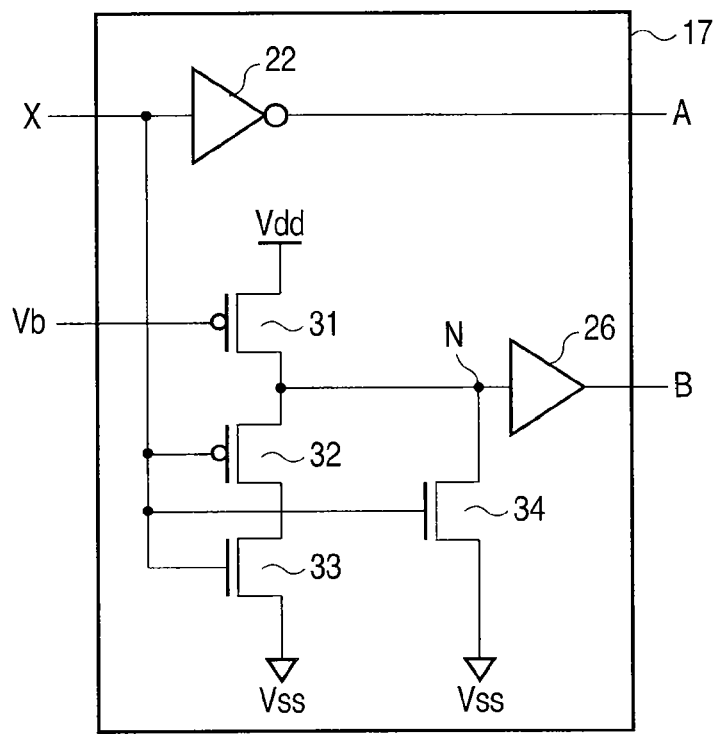
F I G. 15
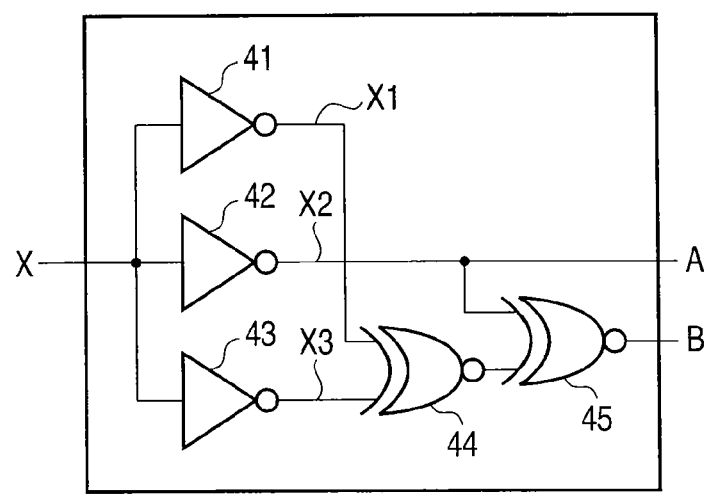
F I G. 16

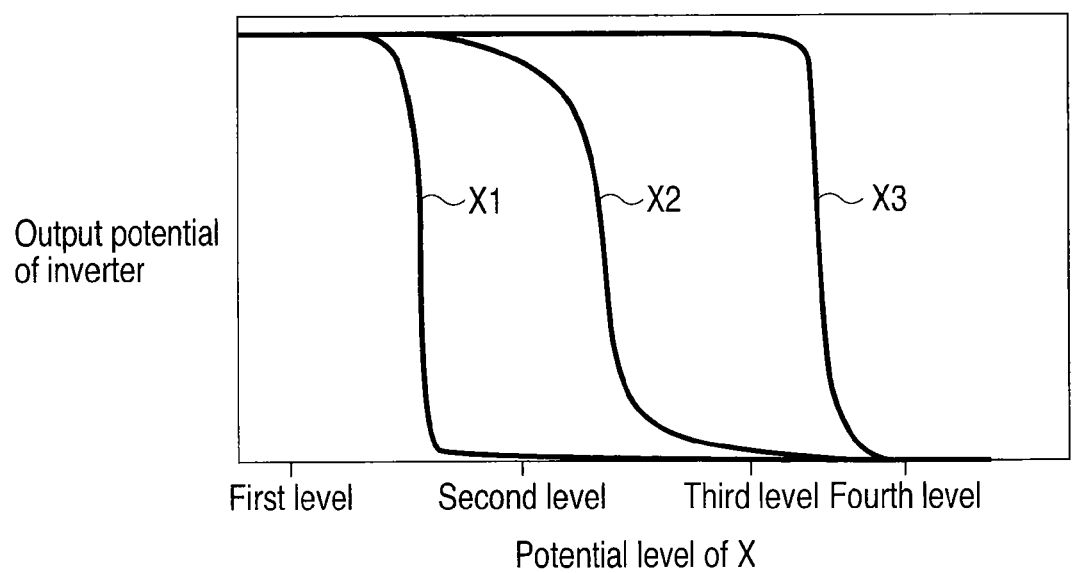
F I G. 17

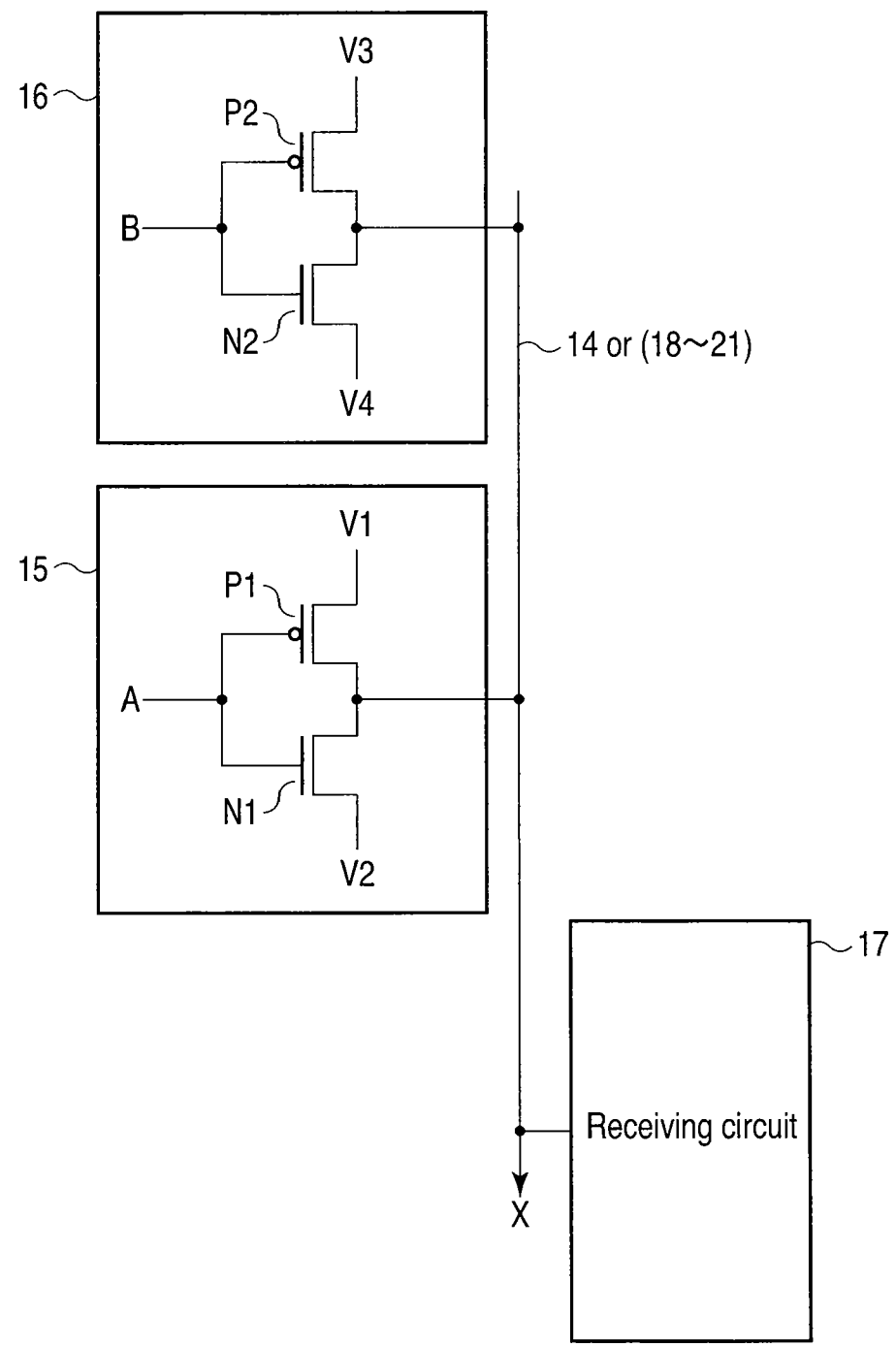
F I G. 18

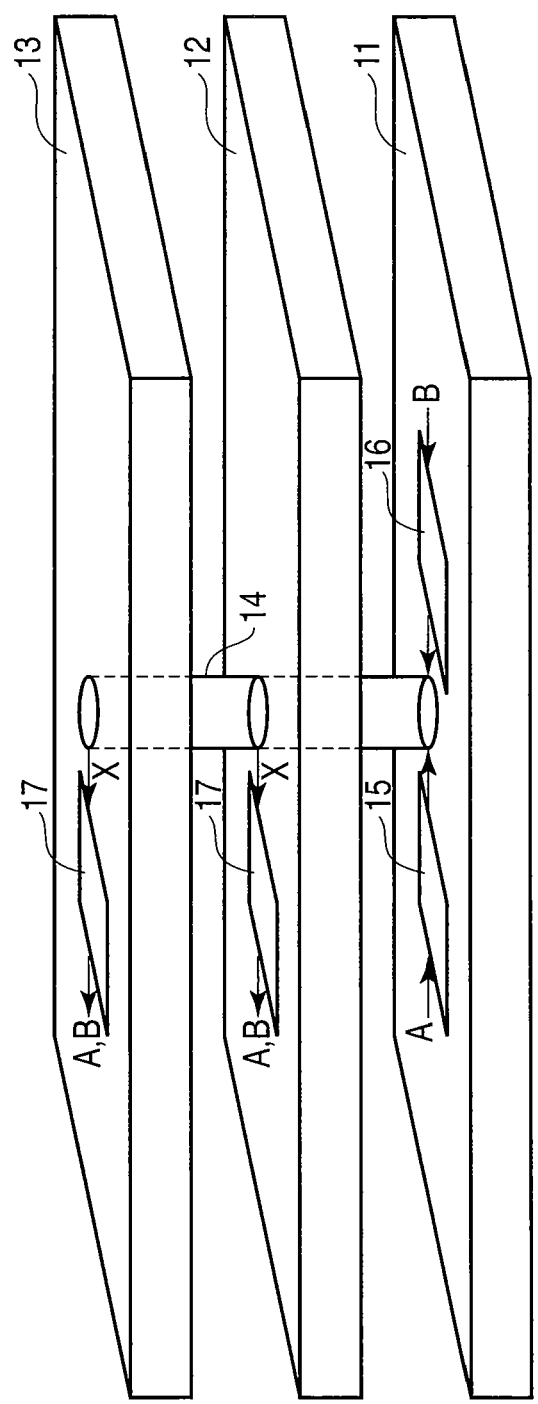
F I G. 20

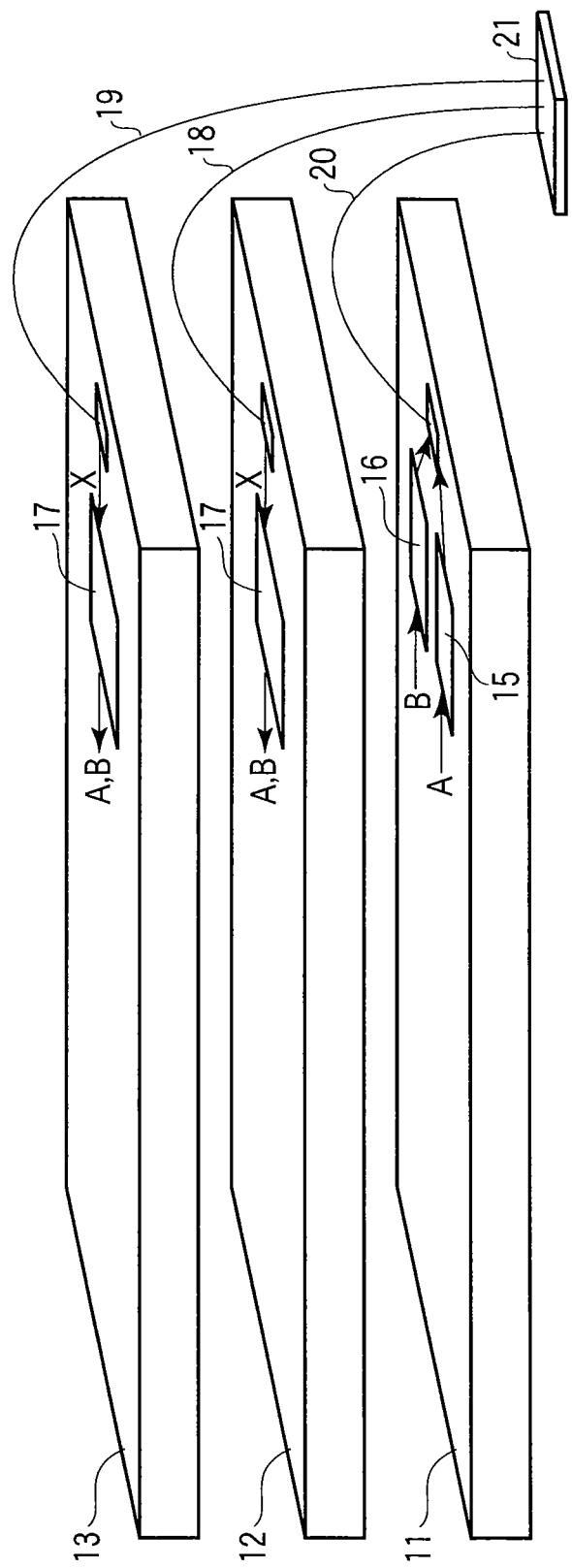
F I G. 21

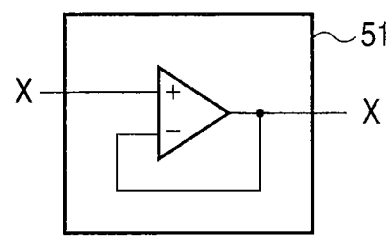
F I G. 23
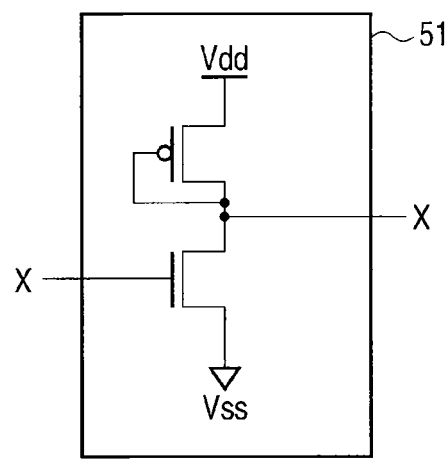
F I G. 24
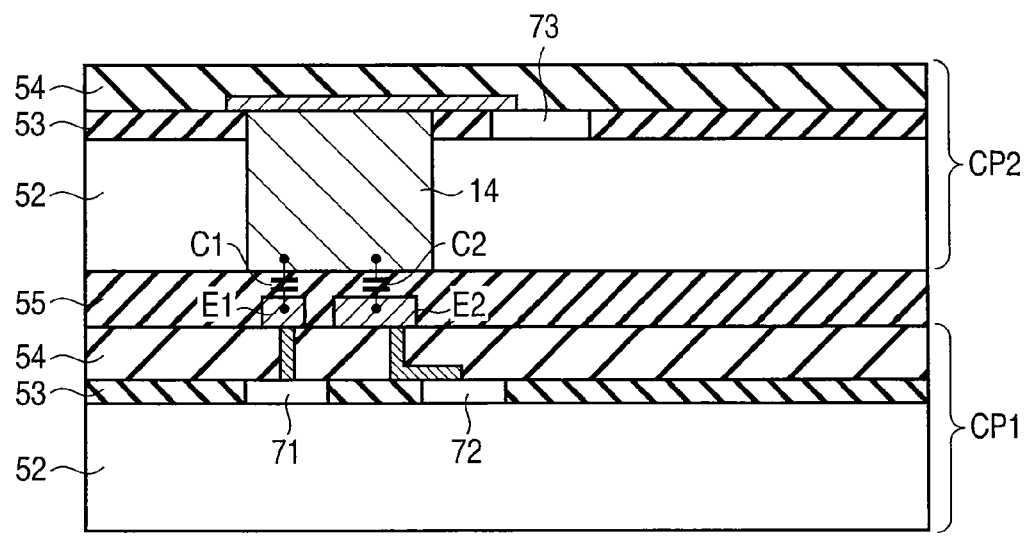
F I G. 25

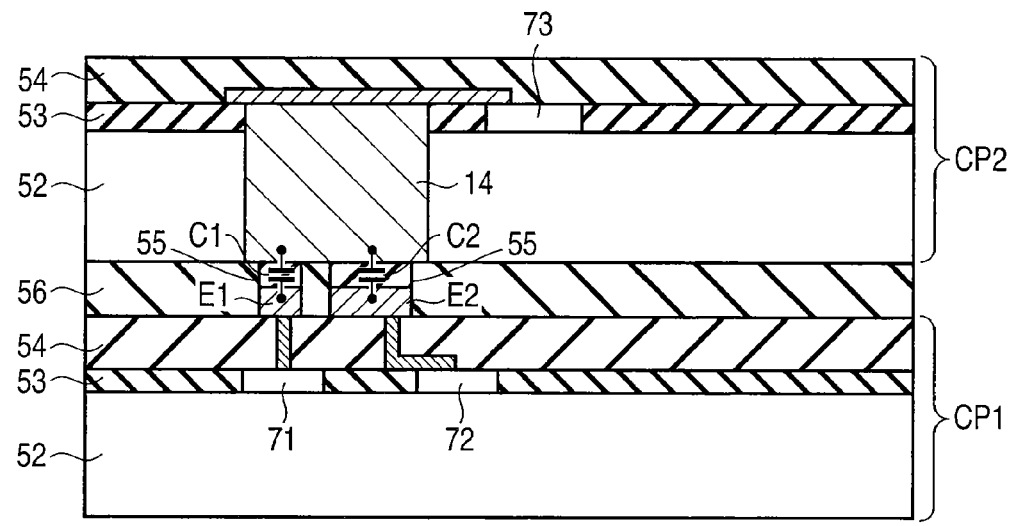
F I G. 26
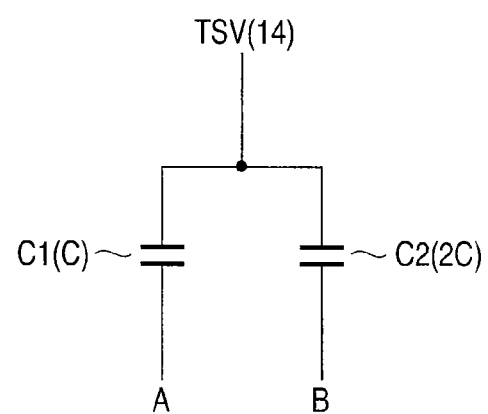
F I G. 27

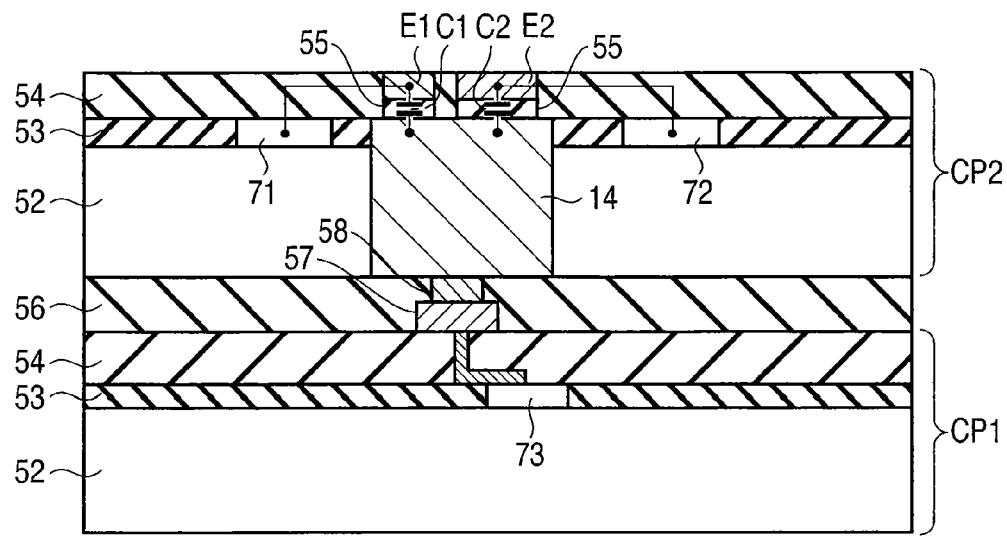
F I G. 28
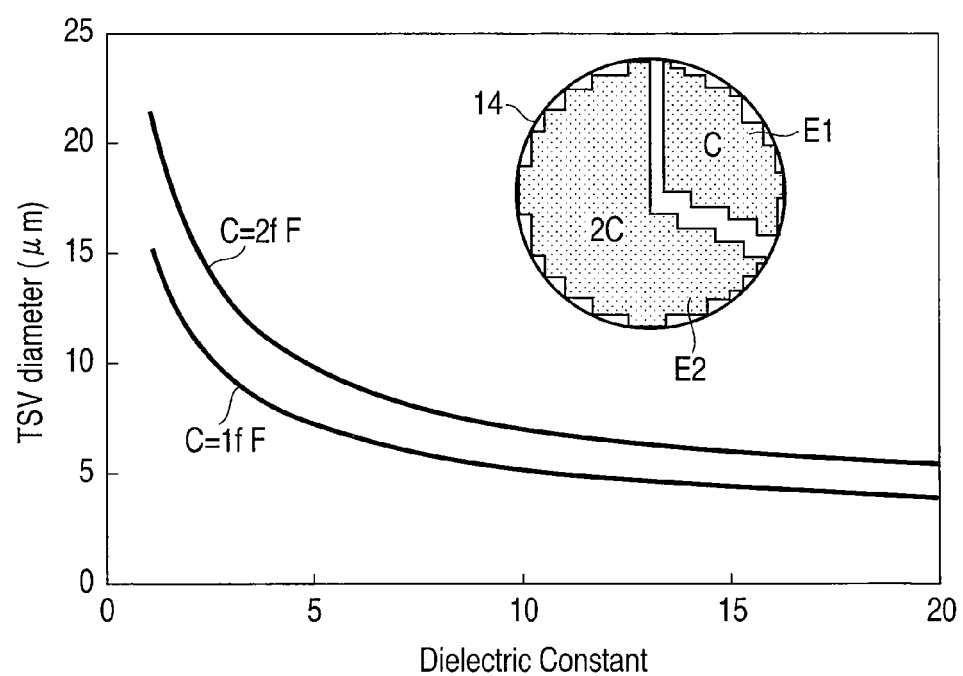
F I G. 29

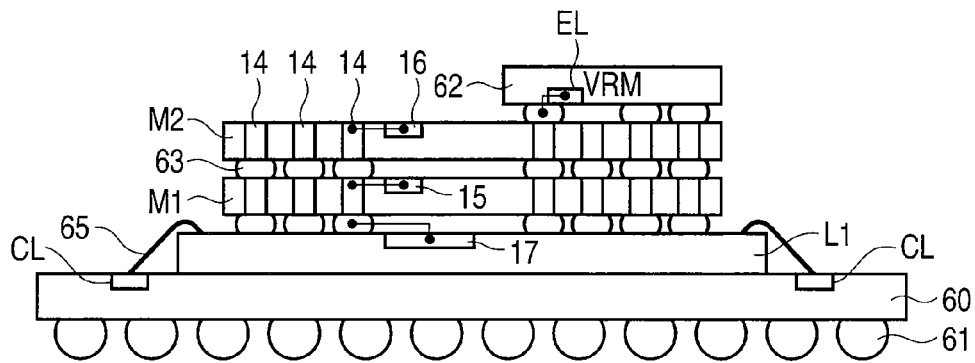
F I G. 32
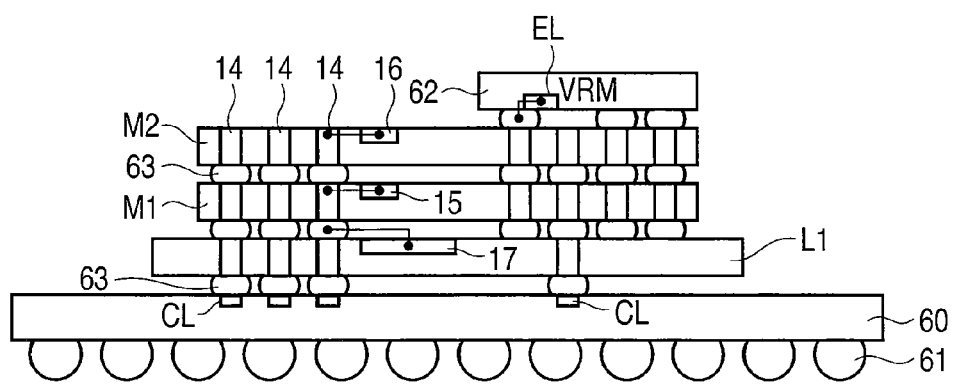
F I G. 33

US 8,497,732 B2

THREE-DIMENSIONAL SEMICONDUCTOR INTEGRATED CIRCUIT

CROSS REFERENCE TO RELATED APPLICATIONS

This application is a Continuation Application of PCT Application No. PCT/JP2010/054934, filed Mar. 23, 2010 and based upon and claiming the benefit of priority from prior Japanese Patent Application No. 2009-073896, filed Mar. 25, 2009, the entire contents of all of which are incorporated herein by reference.

FIELD

Embodiments described herein relate generally to a three-dimensional semiconductor integrated circuit.

BACKGROUND

Recently, there has been proposed a three-dimensional semiconductor integrated circuit utilizing a through silicon via (TSV) as a method to reduce an increase in wiring delay while also increasing a degree of semiconductor integrated circuit integration.

The through silicon via denotes a via penetrating stacked chips (i.e., semiconductor substrates) as a known interface technology by which semiconductor integrated circuits formed in chips are mutually connected.

In the present specification, a chip to be a target to which a through silicon via is arranged is not limited to silicon (Si) regardless of the description of a through silicon via.

Compared to a bonding wire, with a through silicon via, parasitic resistance and parasitic capacity relevant to an interface can be suppressed to be low while the number of chips being mounted within a single package can be increased. Accordingly, it is also effective for high speed operation.

Incidentally, the wiring width of a semiconductor integrated circuit is 1 μm or less, owing to the miniaturization progress. On the other hand, in consideration of the alignment accuracy among chips, a through silicon via is to be sized within a range between several micrometers and several tens of micrometers. Further, naturally, a semiconductor integrated circuit cannot be formed in an area to which a through silicon via is formed.

Accordingly, through silicon vias cause a problem that the area in which semiconductor integrated circuits can be formed is decreased with the increase of the number of the through silicon vias.

A multiplex transmission technology is easily conceived as a technology to solve the above problem.

The multiplex transmission technology involves a type of pulse-amplitude modulation to indicate the amplitude of a digital signal with potential levels, and not with binary of "low (L)" and "high (H)". For example, two-bit binary data can be expressed as one signal having four potential levels.

In order to generate multi-leveled data from binary data with the multiplex transmission technology of the related art, all of the binary data to be multi-leveled is collected to one place and is input to one conversion circuit.

Accordingly, for a three-dimensional semiconductor integrated circuit utilizing a through silicon via with an assumed model which converts binary data from semiconductor integrated circuits in stacked different chips into multi-leveled data and which further transmits the multi-leveled data to another chip, the above multiplex transmission technology becomes meaningless.

Specifically, in order to collect binary data from semiconductor integrated circuits in chips to one place, a through silicon via is separately required therefore. That is, since a through silicon via is required to be newly disposed for generating multi-leveled data, the effect of reducing the number of through silicon vias owing to multiplex transmission is cancelled out thereby.

Further, there has been known a technology to perform multiplex transmission with current levels. However, in this case as well, a similar problem occurs as collecting all of binary data to be multi-leveled to one place.

Such a problem occurs with a three-dimensional semiconductor integrated circuit in which stacked chips are mutually connected by a bonding wire not only by a through silicon via.

This is because reducing the number of bonding wires has been a subject for a three-dimensional semiconductor integrated circuit.

BRIEF DESCRIPTION OF THE DRAWINGS

FIGS. 3 to 5 are views, each illustrating a transmitting circuit.

FIGS. 9 and 10 are views, each illustrating potential levels appearing at a common conductor.

FIGS. 13 and 14 are views, each illustrating potential levels appearing at a common conductor.

FIGS. 15 and 16 are views, each illustrating a receiving circuit.

FIG. 17 is a view illustrating relation between a potential level of an input signal X of FIG. 16 and an output potential of inverters 41, 42, 43.

FIGS. 18 and 19 are views, each illustrating a transmitting circuit when multi-leveling is performed with current levels.

FIG. 20 is a view illustrating a first structure for bidirectional transmission.

FIG. 21 is a view illustrating a second structure for bidirectional transmission.

FIGS. 23 and 24 are views, each illustrating an example of the buffer.

FIGS. 25 and 26 are views, each illustrating a first modified example of the embodiment.

FIG. 27 is a view illustrating a principle of signal transfer.

FIG. 28 is a view illustrating a second modified example of the embodiment.

FIG. 29 is a view illustrating a relation between a dielectric constant of a capacitor and a via size.

FIGS. 32 and 33 are views, each illustrating an application example.

DETAILED DESCRIPTION

Figure 1:
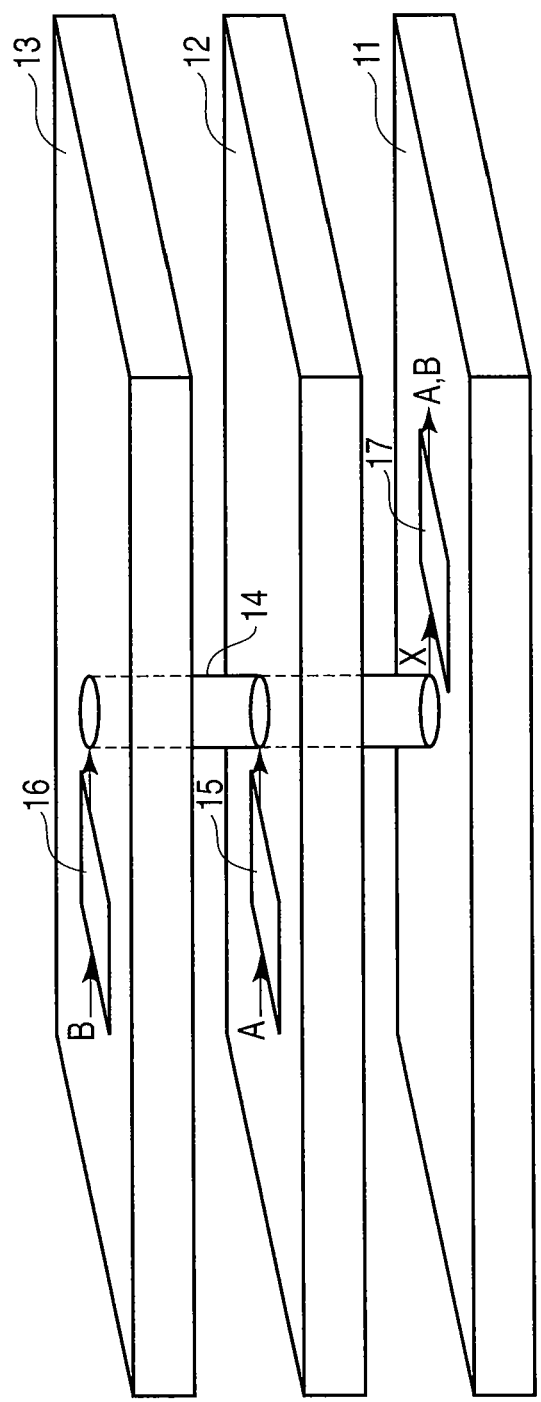
FIG. 1 is a view illustrating a first structure of the embodiment.

In general, according to one embodiment, a three-dimensional semiconductor integrated circuit, comprising: first, second and third chips which are stacked; and a common conductor which connects the first, second and third chips from one another, wherein two of the first, second and third chips are a first transmitting side chip including a first multi-leveling circuit and a second transmitting side chip including a second multi-leveling circuit, the remaining one other than the first and second transmitting side chips is a receiving side chip including a decoding circuit, the first multi-leveling circuit includes a first inverter to which binary first data is input and which outputs one of first and second potentials and a first capacitor which is connected between an output terminal of the first inverter and the common conductor, the second multi-leveling circuit includes a second inverter to which binary second data is input and which outputs one of third and fourth potentials and a second capacitor which is connected between an output terminal of the second inverter and the common conductor, a product of the first potential and a capacity of the first capacitor and a product of the second potential and the capacity of the first capacitor are different from each other, a product of the third potential and a capacity of the second capacitor and a product of the fourth potential and the capacity of the second capacitor are different from each other, at least either a product of the first potential and the capacity of the first capacitor and a product of the third potential and the capacity of the second capacitor or a product of the second potential and the capacity of the first capacitor and a product of the fourth potential and the capacity of the second capacitor are different from each other, the first and second multi-leveling circuits generate multi-leveled third data constituted with four or more potential levels at the common conductor, and the decoding circuit decodes the third data to the binary first and second data.

1. Basic Concept

The embodiment is intended for a three-dimensional semiconductor integrated circuit which is constituted with a plurality of stacked chips. The point is that such a three-dimensional semiconductor integrated circuit is required to have less common conductors (e.g., through silicone vias, boding wires and the like) to connect a plurality of chips owing to layout restrictions.

In this specification, "chip" donates a chip area in a wafer as well as a single chip. Further, "a plurality of stacked chips" donates a case that a plurality of chips are stacked on a single chip in same layer, as well as a case that a plurality of chips are stacked perpendicularly on multiple layers.

Thus, the embodiment proposes a technology to generate a multi-leveled data without collecting the binary data from a plurality of chips to one place and transmit the multi-leveled data to another chip by using a common conductor.

Specifically, in one embodiment, a transmitting circuit is added respectively to a plurality of chips to be a transmitting side. The transmitting circuit includes an inverter to which binary data is input and a capacitor which is connected between an output terminal of the inverter and the common conductor. Further, arrangement is performed to set products of an output potential of each inverter and a capacity of each capacitor to differ from one another among the respective chips.

With the above configuration, binary data from the respective chips appear at the common conductor as multi-leveled data through the transmitting circuit. There are four or more potential levels of multi-leveled data. The multi-leveled data have the potential levels according to the combination of the binary data from the respective chips.

The multi-leveled data appearing at the common conductor as four or more potential levels are input to a receiving side and the multi-leveled data are decoded to the binary data by a receiving circuit in a chip of the receiving side.

In other embodiment, a transmitting circuit constituted with an inverter to which binary data is input is added to a plurality of chips to be the transmitting side. Further, arrangement is performed to set currents to charge/discharge a common conductor by the inverter to differ from one another among the respective chips.

With the above configuration, binary data from the respective chips appear at the common conductor as multi-leveled data having four or more current levels through the transmitting circuit.

The multi-leveled data appearing at the common conductor as four or more current levels are input to a receiving side. A receiving circuit in a chip of the receiving side converts the four or more current levels into four or more potential levels and decodes the binary data, for example.

Here, the function to decode to binary data can be easily actualized with a circuit which utilizes a negative differential resistance (NDR) element.

2. Embodiments (1) First Structure

FIG. 1 illustrates a three-dimensional semiconductor integrated circuit according to a first structure.

This is the three-dimensional semiconductor integrated circuit in which a common conductor connecting a plurality of chips is a through silicon via.

Three chips (i.e., semiconductor substrates) 11, 12, 13 are vertically stacked against chip surfaces. In this example, description is given for a case that the lowermost chip 11 is the receiving side and the two chips 12, 13 are the transmitting side. However, not limited to the above positional relation among the chips of the receiving side and the transmitting side, it is easily arranged by utilizing a similar technology for the receiving side chip to be placed uppermost or to be sandwiched between the transmitting side chips.

The chip 12 includes a transmitting circuit 15. The transmitting circuit 15 receives binary data A which is to be transferred from the chip 12 to the chip 11 and outputs to a through silicon via 14 as the common conductor after processing the binary data A.

Similarly, the chip 13 includes a transmitting circuit 16. The transmitting circuit 16 receives binary data B which is to be transferred from the chip 13 to the chip 11 and outputs to the through silicon via 14 as the common conductor after processing the binary data B.

The chip 11 includes a receiving circuit 17. The receiving circuit 17 has a function to receive multi-leveled data X appearing at the through silicon via 14 and to decode the multi-leveled data X to the binary data A, B.

Here, sizes of the chips 11, 12, 13 are not specifically restricted.

Although all of the chips 11, 12, 13 are illustrated as having similar size, it is also possible for all of the chips to be formed differently in size from one another. Alternatively, it is also possible that the chips 12, 13 are formed similarly in size and that the chip 11 is formed larger than the chips 12, 13.

Further, types (i.e., functions) of the chips 11, 12, 13 are also not specifically restricted.

For example, when the chip 11 is to be a logic chip (e.g., a CPU) having a control circuit and the chips 12, 13 are to be memory chips (e.g., flash memory chips) controlled by the control circuit in the chip 11, a three-dimensional memory system having a large memory capacity can be structured.

(2) Second Structure

Figure 2:
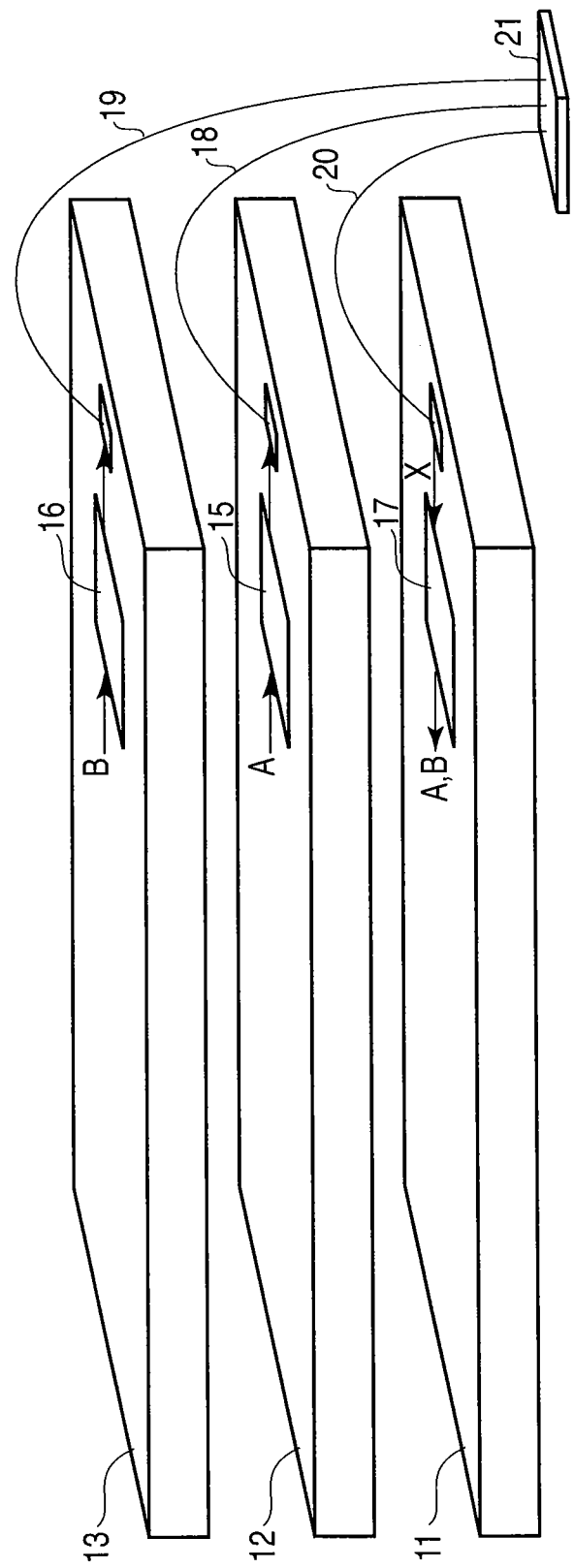
FIG. 2 is a view illustrating a second structure of the embodiment.

FIG. 2 illustrates a three-dimensional semiconductor integrated circuit according to a second structure.

This is the three-dimensional semiconductor integrated circuit in which a common conductor connecting a plurality of chips is a bonding wire.

Three chips (i.e., semiconductor substrates) 11, 12, 13 are vertically stacked against chip surfaces. In this example, description is given on a case that the lowermost chip 11 is the receiving side and the two chips 12, 13 are the transmitting side. However, not limited to the above positional relation among the chips of the receiving side and the transmitting side, it is easily arranged by utilizing a similar technology for the receiving side chip to be placed uppermost or to be sandwiched between the transmitting side chips.

The chip 12 includes a transmitting circuit 15. The transmitting circuit 15 receives binary data A which is to be transferred from the chip 12 to the chip 11 and outputs to a bonding wire 18 and a pad 21 as the common conductor after processing the binary data A.

Similarly, the chip 13 includes a transmitting circuit 16. The transmitting circuit 16 receives binary data B which is to be transferred from the chip 13 to the chip 11 and outputs to a bonding wire 19 and the pad 21 as the common conductor after processing the binary data B.

The chip 11 includes a receiving circuit 17. The receiving circuit 17 has a function to receive multi-leveled data X appearing at a bonding wire 20 and the pad 21 and to decode the multi-leveled data X to the binary data A, B.

Here, sizes of the chips 11, 12, 13 are not specifically restricted.

Although all of the chips 11, 12, 13 are illustrated as having similar size, it is also possible that all thereof are formed differently in size from one another. Alternatively, it is also possible that the chips 12, 13 are formed similarly in size and that the chip 11 is formed larger than the chips 12, 13.

Further, types (i.e., functions) of the chips 11, 12, 13 are also not specifically restricted.

For example, when the chip 11 is to be a logic chip (e.g., a CPU) having a control circuit and the chips 12, 13 are to be memory chips (e.g., flash memory chips) controlled by the control circuit in the chip 11, a three-dimensional memory system having a large memory capacity can be structured.

(3) Transmitting Circuit

Figure 3:
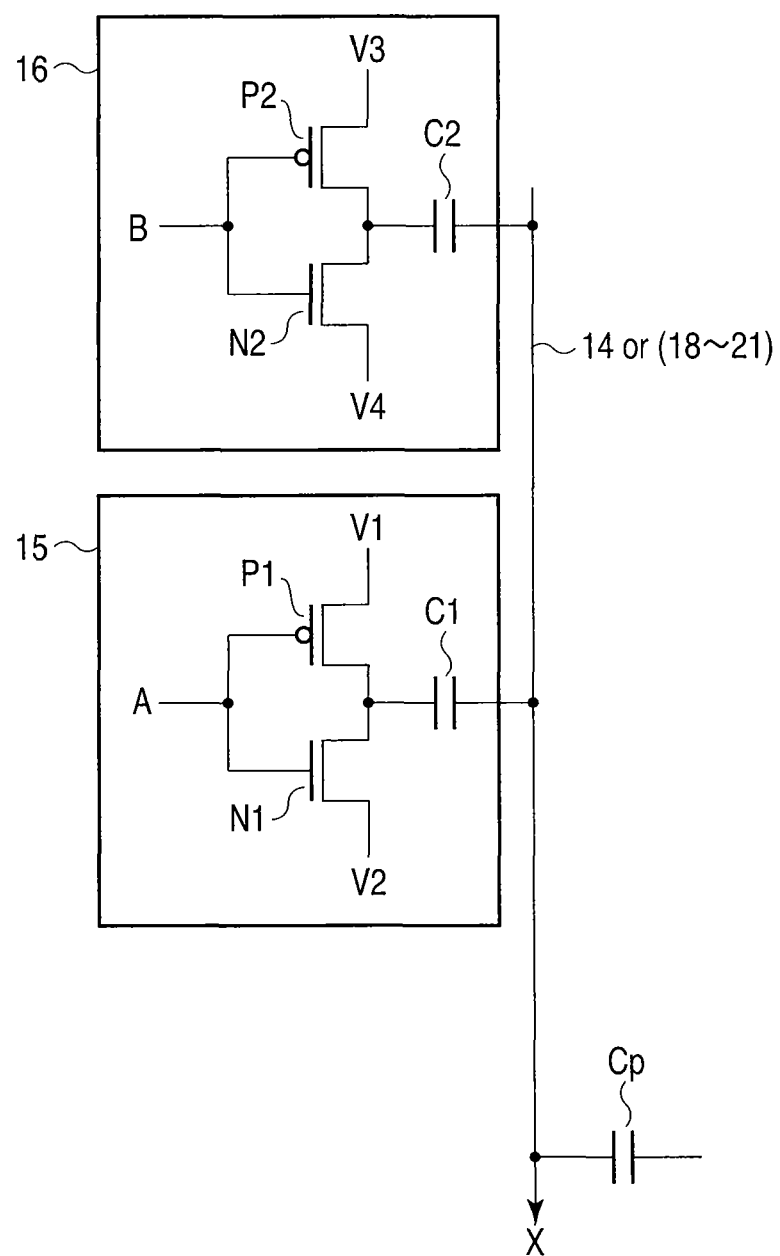

FIG. 3 illustrates a transmitting circuit.

The transmitting circuit 15 includes an inverter and a capacitor C1. The inverter includes P-channel MOS transistor P1 and N-channel MOS transistor N1, and the inverter is expressed as inverter P1, Ni. The binary data A is input to the inverter P1, N1, and the inverter P1, N1 outputs one of high potential V1 and low potential V2. The capacitor C1 is connected between output terminals of the inverter P1, N1 and the common conductor 14 (18 to 21). Here, C1 denotes the capacity of the capacitor C1.

The transmitting circuit 16 includes inverter P2, N2, and a capacitor C2. The binary data B is input to the inverter P1, N1, and the inverter P1, N1 outputs one of high potential V3 and low potential V4. The capacitor C2 is connected between output terminals of the inverter P2, N2 and the common conductor 14 (18 to 21). Here, C2 denotes the capacity of the capacitor C2.

The transmitting circuit is actualized at low power consumption being capable of suppressing power consumption due to multi-leveling at the order of a CMOS inverter by utilizing the capacitors C1, C2 as described above.

Here, Cp denotes a capacity summing all capacities (e.g., floating capacities of the common conductor 14 (18 to 21), a gate capacity of the receiving circuit, and the like) generated at the common conductor 14 (18 to 21) other than the capacitors C1, C2. With the above configuration, voltage of common conductor 14 may be a case of being unstable without a charge amount being determined at an initial state as the common conductor 14 (18 to 21) being in a floating state. In order to avoid the above, it is only required to determine the initial state of charges by connecting an N-channel MOS transistor for pull-down or a P-channel MOS transistor for pull-up (not illustrated) to the common conductor 14 (18 to 21).

In the transmitting circuits 15, 16 of the embodiment, a product $C1 \times V1$ of the high potential V1 and the capacity of the capacitor C1 and a product $C1 \times V2$ of the low potential V2 and the capacity of the capacitor C1 are different from each other and a product $C2 \times V3$ of the high potential V3 and the capacity of the capacitor C2 and a product $C2 \times V4$ of the low potential V4 and the capacity of the capacitor C2 are different from each other.

Further, at least either $C1 \times V1$ and $C2 \times V3$ or $C1 \times V2$ and $C2 \times V4$ are different from each other.

With the above configuration, it is possible to generate multi-leveled data (i.e., four-leveled data) X indicated by four potential levels at the common conductor 14 (18 to 21) even when potential levels ("H"/"L") of the binary data A, B are equaled and a threshold value of the inverters P1, N1 and a threshold value of the inverters P2, N2 are equaled.

The above are specifically indicated as Table 1 when the capacity Cp is a capacity against the ground potential.

TABLE 1

| Binary data | | Potential X of common conductor |
|---|---|---|
| A | B | |
| 0 | 0 | (C1V1 + C2V3)/(C1 + C2 + Cp) |
| 0 | 1 | (C1V1 + C2V4)/(C1 + C2 + Cp) |
| 1 | 0 | (C1V2 + C2V3)/(C1 + C2 + Cp) |
| 1 | 1 | (C1V2 + C2V4)/(C1 + C2 + Cp) |

When the binary data A is "0" and the binary data B is "0", the potential X appearing at the common conductor 14 (18 to 21) is to be (C1V1+C2V3)/(C1+C2+Cp).

When the binary data A is "0" and the binary data B is "1", the potential X appearing at the common conductor 14 (18 to 21) is to be (C1V1+C2V4)/(C1+C2+Cp).

When the binary data A is "1" and the binary data B is "0", the potential X appearing at the common conductor 14 (18 to 21) is to be (C1V2+C2V3)/(C1+C2+Cp).

When the binary data A is "1" and the binary data B is "1", the potential X appearing at the common conductor 14 (18 to 21) is to be (C1V2+C2V4)/(C1+C2+Cp).

Here, when the chips 12, 13 are at the transmitting side, the chips 12, 13 are to be chips of the same type (e.g. memory chips) having the same function in most cases. The chips of the same type are required to have the same design specifications.

Figure 4:
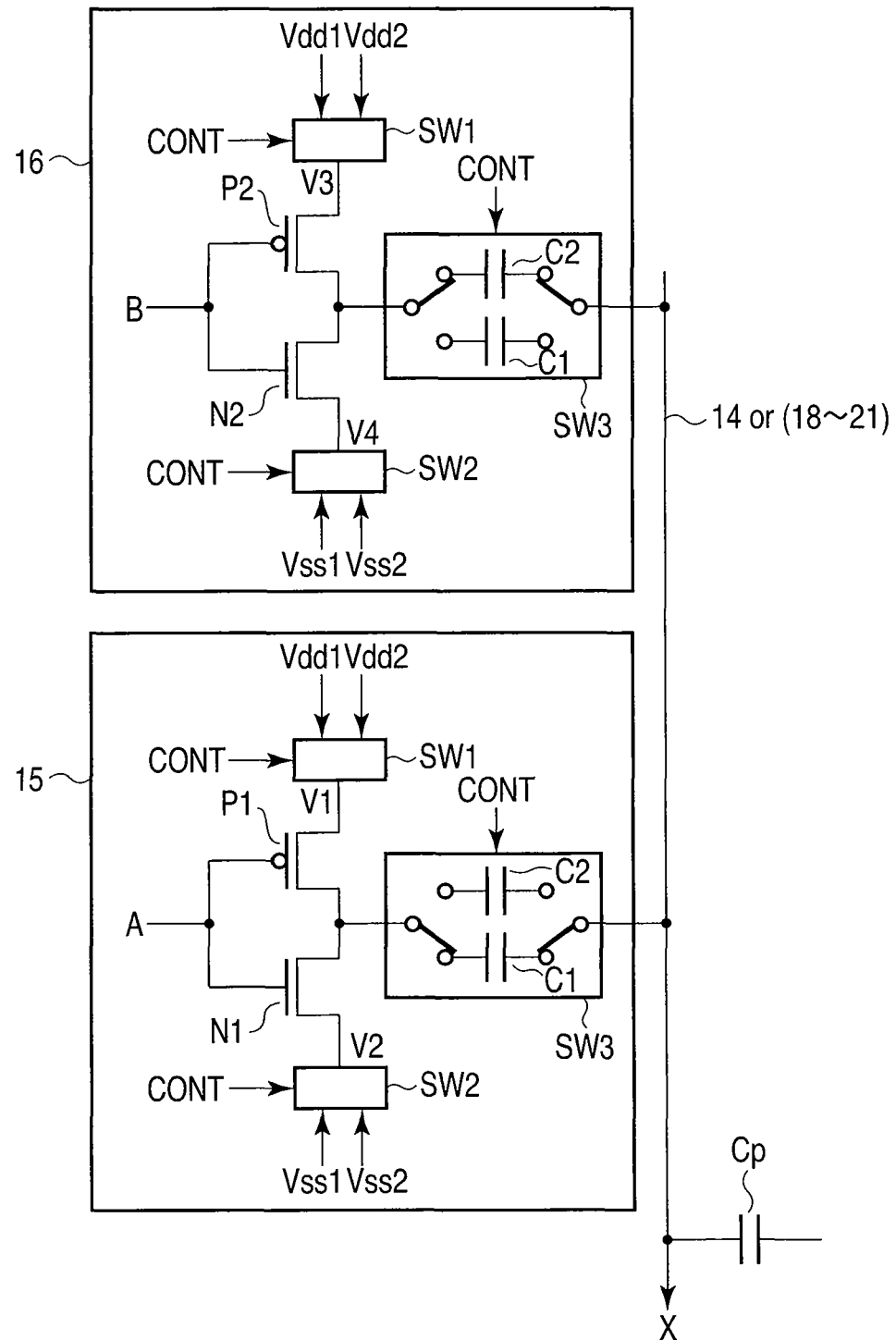

Actually, as illustrated in FIG. 4, the transmitting circuits 15, 16 are set to have the same structure and are configured so that values (Vdd1, Vdd2) of the potentials V1, V3 can be switched by a switch circuit SW1 based on a control signal CONT.

Further, it is configured so that values (Vss1, Vss2) of the potentials V2, V4 can be switched by a switch circuit SW2 based on the control signal CONT.

Further, it is configured so that values of the capacities C1, C2 can be switched by a switch circuit SW3 based on the control signal CONT.

When the high potential V1 and the high potential V3 are the same and the low potential V2 and the low potential V4 are the same, the capacity C1 and the capacity C2 are differentiated by the control signal CONT. In this case, it is also possible to fix V1 to V4 as "V1=V3=Vdd" and "V2=V4=Vss" without disposing the switch circuits SW1, SW2. Here, Vdd is larger than Vss.

Alternatively, when the capacity C1 and the capacity C2 have the same value, V1 to V4 are differentiated by the control signal CONT. In this case, it is also possible to fix C1 and C2 as "C1=C2=Cfix" without disposing the switch circuit SW3.

Naturally, C1 and C2 may be differentiated while V1 to V4 are differentiated.

Here, when the potential level of "H" of the binary data A, B is set to be higher than V1 and V3 and the potential level of "L" of the binary data A, B is set to be lower than V2 and V4, operation of the transmitting circuits 15, 16 can be enhanced in speed.

The above example is described for the case of generating the multi-leveled data (i.e., the four-leveled data) X having four potential levels. However, it is naturally possible as well to generate multi-leveled data having four or more potential levels (e.g., eight-leveled data, sixteen-leveled data and thirty-two-leveled data, and the like).

Further, the number of chips is not restricted as well. Naturally, it is also possible for the three-dimensional semiconductor integrated circuit to be structured by three or more chips.

As an example, an equivalent circuit in a case of generating eight-leveled data at the common conductor 14 (18 to 21) is illustrated in FIG. 5.

In the drawing, transmitting circuits are denoted by S1 to S3. Binary data are denoted by A, B and C. MOS transistors respectively constituting inverters are denoted by P1 to P3 and N1 to N3. Capacitors are denoted by C1, C2 and C3. A capacitance occurring at the common conductor 14 (18 to 21) other than C1, C2 and C3 is denoted by Cp. The eight-leveled data appearing at the common conductor 14 (18 to 21) is denoted by X.

(4) Operational Example

In the following, an operational example of the transmitting circuit of FIG. 3 will be described.

A prerequisite is for "C1V1>C2V3>C1V2>C2V4" to be satisfied.

If "V1=V3=Vdd" and "V2=V4=Vss", C1 is to be larger than C2.

Alternatively, if "C1=C2=Cfix", "V1>V3 >V2>V4" is to be satisfied.

In general, the area of a capacitor formed on a chip is larger than that of a logic gate (e.g., a MOS transistor). Therefore, it is effective to set the values of C1 and C2 as "C1=C2=Cfix" and control the values of V1 to V4 for suppressing area overhead due to disposing an interface circuit according to the embodiment.

Figure 6:
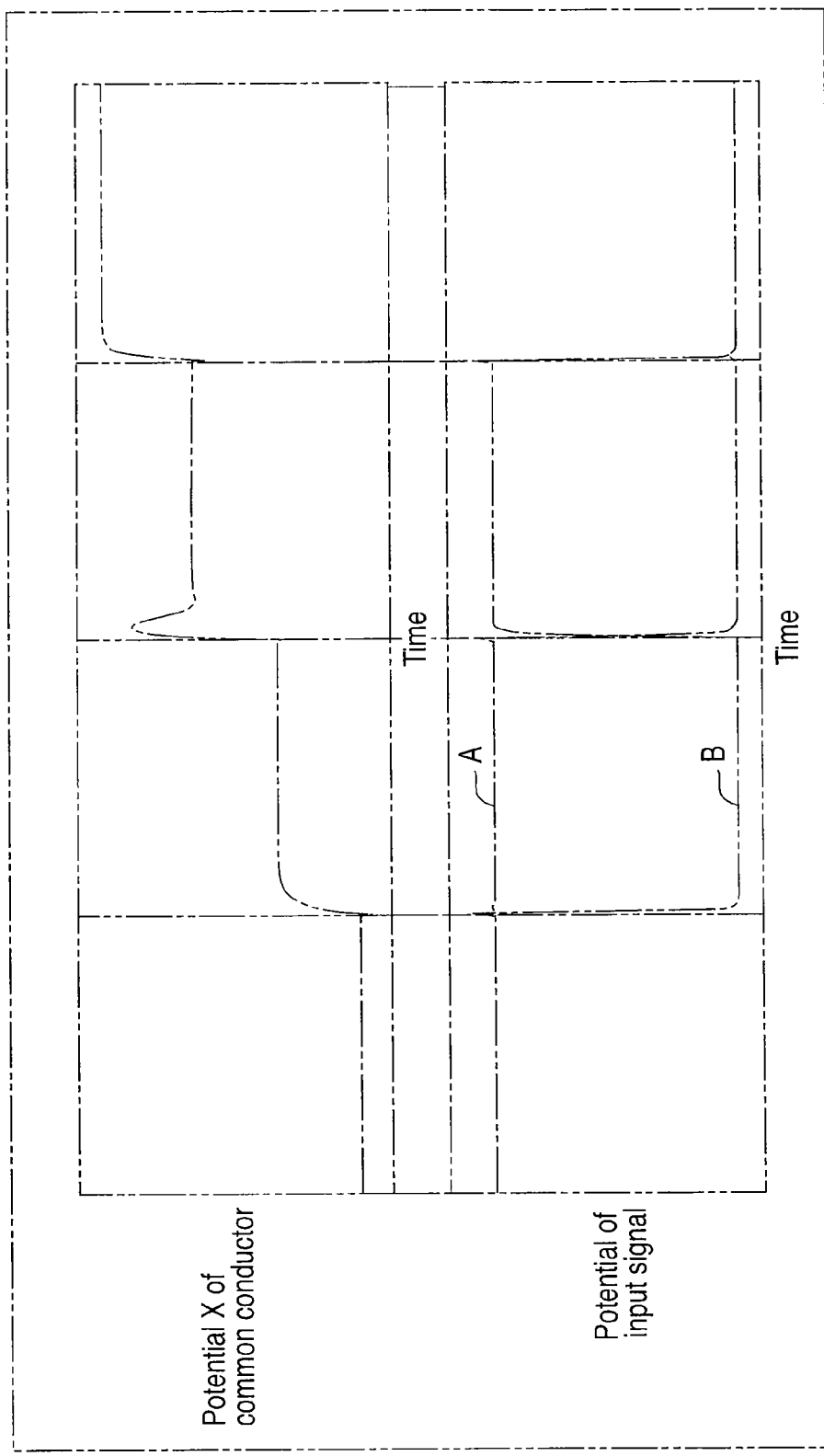
FIG. 6 is a view illustrating potential levels appearing at a common conductor.

FIG. 6 indicates how the potential appears at the common conductor against the binary data A, B under the above prerequisite.

As illustrated in FIG. 6, when the binary data A is "1" and the binary data B is "1", the potential X appearing at the common conductor is to be the first level (i.e., the minimum value). Specifically, the potential level is "(C1V2+C2V4)/(C1+C2+Cp)".

Further, when the binary data A is "1" and the binary data B is "0", the potential X appearing at the common conductor is to be the second level which is higher than the first level. Specifically, the potential level is "(C1V2+C2V3)/(C1+C2+Cp)".

Further, when the binary data A is "0" and the binary data B is "1", the potential X appearing at the common conductor is to be the third level which is higher than the second level. Specifically, the potential level is "(C1V1+C2V4)/(C1+C2+Cp)".

Lastly, when the binary data A is "0" and the binary data B is "0", the potential X appearing at the common conductor is to be the fourth level (i.e., the maximum value). Specifically, the potential level is "(C1V1+C2V3)/(C1+C2+Cp)".

In consideration of operational margins and operational stability, it is preferable that the values of C1, C2 and V1 to V4 are set so that respective differences between the potential levels are to be the same.

The difference $\Delta 1$ between the first level and the second level is expressed as follows.

$$\Delta 1 = \{(C1V2+C2V3)/(C1+C2+Cp)\} - \{(C1V2+C2V4)/(C1+C2+Cp)\} = C2(V3-V4)/(C1+C2+Cp)$$

The difference $\Delta 2$ between the second level and the third level is expressed as follows.

$$\Delta 2 = \{(C1V1+C2V4)/(C1+C2+Cp)\} - \{(C1V2+C2V3)/(C1+C2+Cp)\} = \{C1(V1-V2)-C2(V3-V4)\}/(C1+C2+Cp)$$

The difference $\Delta 3$ between the third level and the fourth level is expressed as follows.

$$\Delta 3 = \{(C1V1+C2V3)/(C1+C2+Cp)\} - \{(C1V1+C2V4)/(C1+C2+Cp)\} = C2(V3-V4)/(C1+C2+Cp)$$

Accordingly, it is preferable to set the values of C1, C2 and V1 to V4 so as to satisfy "$\Delta 1 = \Delta 2 = \Delta 3$", that is, the following equations.

$$C2(V3-V4) = C1(V1-V2) - C2(V3-V4) V1-V2 = 2(C2/C1)(V3-V4)$$

The following consideration is also required on the capacities C1, C2.

The larger the values of the capacities C1, C2 are, the larger the respective differences between the potential levels become. However, the time from when the binary data A, B are input until the multi-leveled data X is generated at the common conductor is prolonged when the values of the capacities C1, C2 become large.

Accordingly, the values of the capacities C1, C2 are to be determined in consideration of the trade-off between the respective potential level differences (i.e., the margins) and the signal delay.

Further, the capacities C1, C2 are determined in consideration of the value of the capacity Cp.

Since the capacities C1, C2 can be set small without causing performance deterioration, it is preferable that the capacity Cp is small. In consideration of this point, the first structure (i.e., the structure using the through silicon via) illustrated in FIG. 1 is advantageous for constituting a three-dimensional semiconductor integrated circuit compared with the second structure (i.e., the structure using the bonding wire) illustrated in FIG. 2, since the Cp of the first structure is smaller than the Cp of the second structure.

In the above example, the multi-leveled data (i.e., the four-leveled data) having four potential levels is generated. Here, it is also possible on the same principle to generate multi-leveled data having four or more potential levels (e.g., eight-leveled data, sixteen-leveled data, thirty-two-leveled data, and the like).

For example, a prerequisite is satisfied as "C1V1>C2V3>C3V5>C1V2>C2V4>C3V6" with the transmitting circuit of FIG. 5. When the binary data A, B, C are "1", "1", "1" respectively, the potential X appearing at the common conductor is to be "(C1V2+C2V4+C3V6)/(C1+C2+C3+Cp)" as the first level (i.e., the minimum value).

When the binary data A, B, C are "1", "1", "0" respectively, the potential X appearing at the common conductor is to be "(C1V2+C2V4+C3V5)/(C1+C2+C3+Cp)" as the second level.

When the binary data A, B, C are "1", "0", "1" respectively, the potential X appearing at the common conductor is to be "(C1V2+C2V3+C3V6)/(C1+C2+C3+Cp)" as the third level.

When the binary data A, B, C are "1", "0", "0" respectively, the potential X appearing at the common conductor is to be "(C1V2+C2V3+C3V5)/(C1+C2+C3+Cp)" as the fourth level.

When the binary data A, B, C are "0", "1", "1" respectively, the potential X appearing at the common conductor is to be "(C1V1+C2V4+C3V6)/(C1+C2+C3+Cp)" as the fifth level.

When the binary data A, B, C are "0", "1", "0" respectively, the potential X appearing at the common conductor is to be "(C1V1+C2V4+C3V5)/(C1+C2+C3+Cp)" as the sixth level.

When the binary data A, B, C are "0", "0", "1" respectively, the potential X appearing at the common conductor is to be "(C1V1+C2V3+C3V6)/(C1+C2+C3+Cp)" as the seventh level.

When the binary data A, B, C are "0", "0", "0" respectively, the potential X appearing at the common conductor is to be "(C1V1+C2V3+C3V5)/(C1+C2+C3+Cp)" as the eighth level (i.e., the maximum value).

(5) Receiving Circuit

Figure 7:
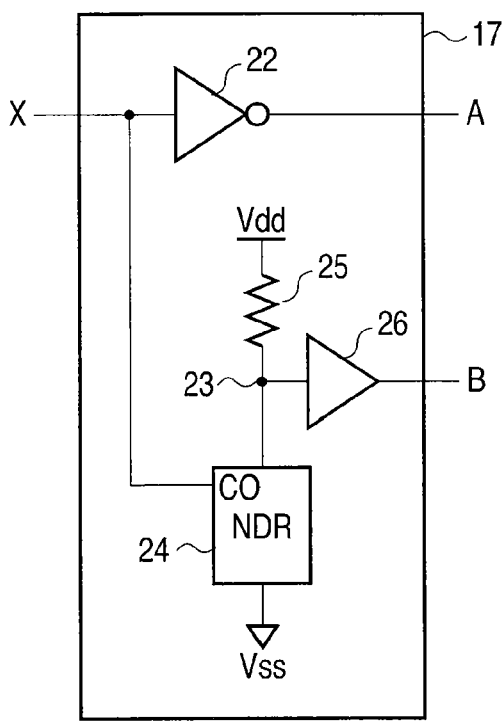
FIG. 7 is a view illustrating a receiving circuit.

FIG. 7 illustrates a first example of the receiving circuit.

The receiving circuit 17 has a function to decode the multi-leveled data (i.e., four-leveled data) X having four potential levels to the binary data A, B.

The multi-leveled data X from the common conductor is input to an input terminal of an inverter 22 and a control terminal CO of a negative differential resistance (NDR) circuit 24. The logical inversion threshold voltage of the inverter 22 is set to be between the second potential level and the third potential level of the multi-leveled data X. An output signal of the inverter 22 is to be the binary data A. One terminal of the NDR circuit 24 is connected to a ground point Vss. A resistive element 25 is connected between the NDR circuit 24 and a power source terminal Vdd. The binary data B is output from a node 23 at which the NDR circuit 24 and the resistive element 25 are connected. The binary data B is amplified by a buffer 26.

The NDR circuit 24 is constituted with an NDR element having a partially negative differential resistance characteristic as decreasing a current amount flowing between the node 23 and the ground point Vss against increase of voltage applied to the control terminal CO. The NDR element is constituted with a tunnel diode, a resonant tunnel diode, a single electron element and the like.

Alternatively, the NDR circuit 24 can be actualized by a combination of a flow-through current of a CMOS circuit and an N-channel type MOS transistor, and the like.

Figure 8:
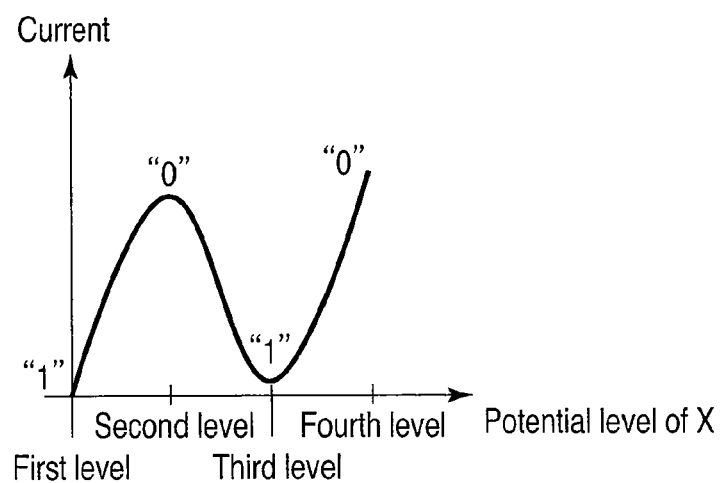
FIG. 8 is a view illustrating an NDR characteristic.

FIG. 8 illustrates characteristics of the NDR circuit 24.

The NDR circuit 24 is required to show a negative differential resistance characteristic at least once against increase of the control terminal voltage. That is, the NDR circuit 24 is designed so that the current amount thereof varies as "small→large→small→large" with increase of the control terminal voltage. At that time, it is preferable that peaks of small and large current amounts are matched to the four potential levels.

When the NDR circuit 24 is utilized, the area of the receiving circuit can be lessened.

Next, an operation of the receiving circuit will be described.

Here, it is assumed that the relation among the binary data A, B to be input to the transmitting circuit and the potential level X of the common conductor becomes as illustrated in FIG. 9. When the potential level X of the common conductor is received by the receiving circuit of FIG. 7, the binary data A, B to be output from the receiving circuit become as illustrated in FIG. 10.

That is, since the threshold value of the inverter 22 is set between the second level and the third level, the binary data A is to be "1" when the potential level X of the common conductor is at the first and second levels while the binary data A is to be "0" when the potential level X of the common conductor is at the third and fourth levels.

Further, when the potential level X of the common conductor is at the first level, the binary data B is to be "1" owing to the smaller amount of the current flowing through the NDR circuit 24.

Further, when the potential level X of the common conductor is at the second level, the binary data B is to be "0" owing to the larger amount of the current flowing through the NDR circuit 24.

Further, when the potential level X of the common conductor is at the third level, the binary data B is to be "1" owing to the smaller amount of the current flowing through the NDR circuit 24.

Furthermore, when the potential level X of the common conductor is at the fourth level, the binary data B is to be "0" owing to the larger amount of the current flowing through the NDR circuit 24.

Accordingly, the correspondence between the binary data A, B of the transmitting circuit side illustrated in FIG. 9 and the binary data A, B of the receiving circuit side illustrated in FIG. 10 can be achieved. That is, transmitting and receiving of data due to multiplex transmission utilizing a common conductor can be accurately performed.

Figure 11:
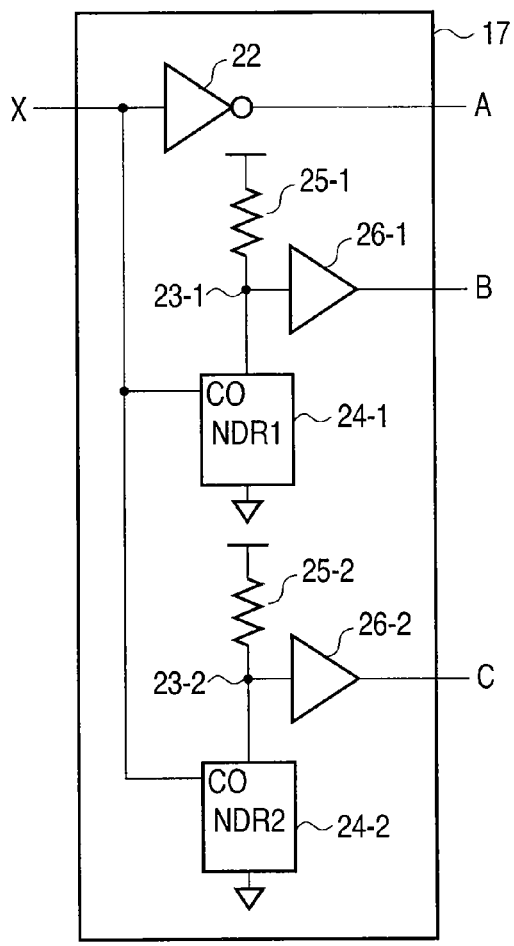
FIG. 11 is a view illustrating a receiving circuit.

FIG. 11 illustrates a second example of the receiving circuit.

The receiving circuit 17 has a function to decode the multi-leveled data (i.e., eight-leveled data) X having eight potential levels to binary data A, B, C.

The multi-leveled data X from the common conductor is input to an input terminal of an inverter 22 and control terminals CO of NDR circuits 24-1, 24-2. An output signal of the inverter 22 is to be the binary data A.

One terminal of the NDR circuit 24-1 is connected to a ground point Vss. A resistive element 25-1 is connected between the NDR circuit 24-1 and a power source terminal Vdd. The binary data B is output from a node 23-1 at which the NDR circuit 24-1 and the resistive element 25-1 are connected. The binary data B is amplified by a buffer 26-1.

One terminal of the NDR circuit 24-2 is connected to the ground point Vss. A resistive element 25-2 is connected between the NDR circuit 24-1 and the power source terminal Vdd. The binary data C is output from a node 23-2 at which the NDR circuit 24-2 and the resistive element 25-2 are connected. The binary data C is amplified by a buffer 26-2.

The NDR circuits 24-1, 24-2 are constituted respectively with an NDR element having a partially negative differential resistance characteristic as decreasing a current amount respectively between the node 23-1 and the ground point Vss and between the node 23-2 and the ground point Vss against increase of voltage applied to each control terminal CO. The NDR element is constituted with a tunnel diode, a resonant tunnel diode, a single electron element and the like.

Alternatively, the NDR circuits 24-1, 24-2 can be actualized respectively by a combination of a flow-through current of a CMOS circuit and an N-channel type MOS transistor, and the like.

Figure 12:
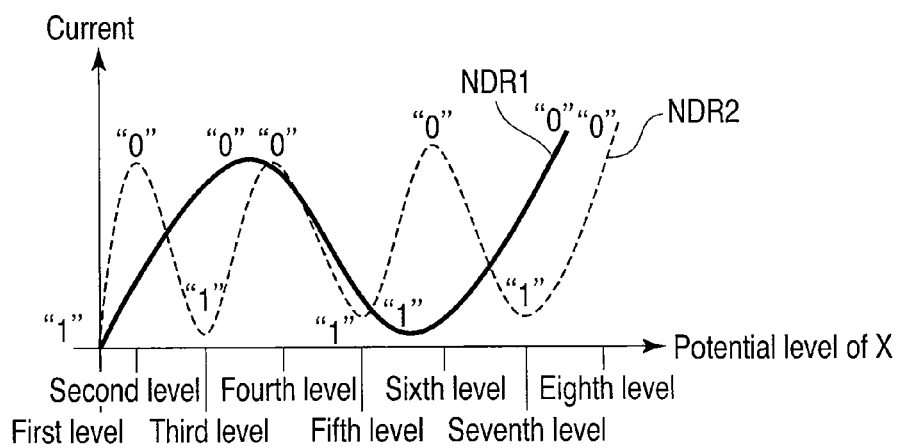
FIG. 12 is a view illustrating an NDR characteristic.

FIG. 12 illustrates characteristics of the NDR circuits 24-1, 24-2.

The NDR circuit 24-1 is required to show a negative differential resistance characteristic at least once against increase of the control terminal voltage. That is, the NDR circuit 24-1 is designed so that the current amount thereof varies as "small→large→small→large" with increase of the control terminal voltage.

At that time, it is preferable that a peak of a local minimum of the current amount is matched to the first, second, fifth and sixth levels and a peak of a local maximum of the current amount is matched to the third, fourth, seventh and eighth levels.

The NDR circuit 24-2 is required to show negative differential resistance characteristics at least three times against an increase of the control terminal voltage. That is, the NDR circuit 24-2 is designed so that the current amount thereof varies as "small→large→small→large, small→large→small→large" with increase of the control terminal voltage.

At that time, it is preferable that peaks of local minimums of the current amount are matched to the first, third, fifth and seventh levels and peaks of local maximums of the current amount are matched to the second, fourth, sixth and eighth levels.

When the NDR circuits 24-1, 24-2 are utilized, the area of the receiving circuit can be lessened.

Next, an operation of the receiving circuit will be described.

Here, it is assumed that the relation among the binary data A, B, C to be input to the transmitting circuits and the potential level X of the common conductor is set as illustrated in FIG. 13. When the potential level X of the common conductor is received by the receiving circuit of FIG. 11, the binary data A, B, C to be output from the receiving circuit become as illustrated in FIG. 14.

That is, since the threshold value of the inverter 22 is set between the fourth level and the fifth level, the binary data A is to be "1" when the potential level X of the common conductor is at the first to the fourth levels while the binary data A is to be "0" when the potential level X of the common conductor is at the fifth to eighth levels.

Further, when the potential level X of the common conductor is at the first level, the binary data B is to be "1" owing to the smaller amount of the current flowing through the NDR circuit 24-1. When the potential level X of the common conductor is at the first level, the binary data C is to be "1" owing to the smaller amount of the current flowing through the NDR circuit 24-2.

Further, when the potential level X of the common conductor is at the second level, the binary data B is to be "1" owing to the smaller amount of the current flowing through the NDR circuit 24-1. When the potential level X of the common conductor is at the second level, the binary data C is to be "0" owing to the larger amount of the current flowing through the NDR circuit 24-2.

Further, when the potential level X of the common conductor is at the third level, the binary data B is to be "0" owing to the larger amount of the current flowing through the NDR circuit 24-1. When the potential level X of the common conductor is at the third level, the binary data C is to be "1" owing to the smaller amount of the current flowing through the NDR circuit 24-2.

Further, when the potential level X of the common conductor is at the fourth level, the binary data B is to be "0" owing to the larger amount of the current flowing through the NDR circuit 24-1. When the potential level X of the common conductor is at the fourth level, the binary data C is to be "0" owing to the larger amount of the current flowing through the NDR circuit 24-2.

Further, when the potential level X of the common conductor is at the fifth level, the binary data B is to be "1" owing to the smaller amount of the current flowing through the NDR circuit 24-1. When the potential level X of the common conductor is at the fifth level, the binary data C is to be "1" owing to the smaller amount of the current flowing through the NDR circuit 24-2.

Further, when the potential level X of the common conductor is at the sixth level, the binary data B is to be "1" owing to the smaller amount of the current flowing through the NDR circuit 24-1. When the potential level X of the common conductor is at the sixth level, the binary data C is to be "0" owing to the larger amount of the current flowing through the NDR circuit 24-2.

Further, when the potential level X of the common conductor is at the seventh level, the binary data B is to be "0" owing to the larger amount of the current flowing through the NDR circuit 24-1. When the potential level X of the common conductor is at the seventh level, the binary data C is to be "1" owing to the smaller amount of the current flowing through the NDR circuit 24-2.

Furthermore, when the potential level X of the common conductor is at the eighth level, the binary data B is to be "0" owing to the larger amount of the current flowing through the NDR circuit 24-1. When the potential level X of the common conductor is at the eighth level, the binary data C is to be "0" owing to the larger amount of the current flowing through the NDR circuit 24-2.

Accordingly, the correspondence between the binary data A, B, C of the transmitting circuit side illustrated in FIG. 13 and the binary data A, B, C of the receiving circuit side illustrated in FIG. 14 can be achieved. That is, transmitting and receiving of data due to multiplex transmission utilizing a single common conductor can be accurately performed.

FIG. 15 illustrates a third example of the receiving circuit.

The receiving circuit 17 has a function to decode the multi-leveled data (i.e., four-leveled data) X having four potential levels to binary data A, B.

The third example has a feature that an NDR circuit is constituted with a combination of a flow-through current of CMOS circuits and N-channel type MOS transistors without utilizing an NDR element.

The multi-leveled data X from the common conductor is input respectively to an input terminal of an inverter 22, a gate of a P-channel MOS transistor 32 and gates of N-channel MOS transistors 33, 34. An output signal of the inverter 22 is to be the binary data A. A source of the MOS transistor 33 is connected to a ground point Vss.

A P-channel MOS transistor 31 is connected between a source of the MOS transistor 32 and a power source terminal Vdd. Gate potential Vb is applied to a gate of the MOS transistor 31. The binary data B is output from a connection point of the two MOS transistors 31, 32. The binary data B is amplified by a buffer 26.

A source of the MOS transistor 34 is connected to the ground point Vss and a drain thereof is connected to the connection point of the two MOS transistors 31, 32.

In this receiving circuit, the value of the binary data A is to be "1" when the potential level of the multi-leveled data X is at the first level (i.e., the minimum value). Further, as a capacity to charge a node N exceeds a capacity to discharge the node N, the value of the binary data B is to be "1".

Further, the value of the binary data A is to be "1" when the potential level of the multi-leveled data X is at the second level. As the capacity to discharge the node N exceeds the capacity to charge the node N, the value of the binary data B is to be "0".

Further, the value of the binary data A is to be "0" when the potential level of the multi-leveled data X is at the third level. As the capacity to charge the node N exceeds the capacity to discharge the node N, the value of the binary data B is to be "1".

Furthermore, the value of the binary data A is to be "0" when the potential level of the multi-leveled data X is at the fourth level (i.e., the maximum value). As the capacity to discharge a node N exceeds the capacity to charge the node N, the value of the binary data B is to be "0".

Here, the gate potential Vb of the P-channel MOS transistor 31 is constant.

Characteristics of a flow-through current of the CMOS circuits 32, 33 and a current of the N-channel MOS transistor 34 are previously determined so that the above binary data B can be obtained corresponding to values of the multi-leveled data X. That is, threshold voltage and current of the MOS transistors 32, 33 are adjusted so that a logical inversion threshold voltage of the CMOS inverter which is constituted with the MOS transistors 32, 33 are to be at the vicinity of the second potential level of the multi-leveled data X. Further, the adjustment is performed so that threshold voltage of the N-channel MOS transistor 34 is to be at the vicinity of the third potential level of the multi-leveled data X. Characteristics of the CMOS circuits 32, 33 and characteristics of the N-channel MOS transistor 34 can be varied by varying the channel impurity concentration, a substrate bias value and the like.

Since an expensive NDR element is not utilized, the third example has an advantage that the system according to the embodiment can be actualized at low cost.

FIG. 16 illustrates a fourth example of the receiving circuit.

The receiving circuit 17 has a function to decode the multi-leveled data (i.e., four-leveled data) X having four potential levels to binary data A, B.

The fourth example has a feature that a receiving circuit is constituted with a CMOS logic circuit, that is, three CMOS inverters and two exclusive NOR (Ex-NOR), without utilizing an NDR element.

The multi-leveled data X from the common conductor is input to input terminals of three inverters 41, 42, 43. Output signals of the two inverters 41, 43 are input to an input terminal of an exclusive NOR 44. Further, an output signal of the inverter 42 and an output signal of the exclusive NOR 44 are input to an input terminal of an exclusive NOR 45.

The output signal of the inverter 42 is to be the binary data A and an output signal of the exclusive NOR 45 is to be the binary data B.

Next, operation of the receiving circuit will be described.

First, as illustrated in FIG. 17, the output signals X1, X2, X3 of the three inverters 41, 42, 43 are to be "1" respectively when the potential level of the multi-leveled data X is at the first level (i.e., the minimum value). Accordingly, both values of the binary data A, B are to be "1".

Further, when the potential level of the multi-leveled data X is at the second level, the output signal X1 of the inverter 41 is to be "0" and the output signals X2, X3 of the inverters 42, 43 are "1". Accordingly, the value of the binary data A is to be "1" and the value of the binary data B is to be "0".

Further, when the potential level of the multi-leveled data X is at the third level, the output signals X1, X2 of the inverters 41, 42 are to be "0" and the output signal X3 of the inverter 43 is "1". Accordingly, the value of the binary data A is to be "0" and the value of the binary data B is to be "1".

Furthermore, when the potential level of the multi-leveled data X is at the fourth level (i.e., the maximum value), the output signals X1, X2, X3 of the three inverters 41, 42, 43 are respectively to be "0". Accordingly, the value of the binary data A is to be "0" and the value of the binary data B is to be "0".

Here, characteristics of the inverters 41, 42, 43 such as threshold values are previously determined so that the above binary data B can be obtained corresponding to values of the multi-leveled data X. The characteristics of the inverters 41, 42, 43 can be varied by varying the channel impurity concentration, a substrate bias value, the channel length and channel width of the MOS transistors which constitute the inverters 41, 42, 43 or adding a resistance between the power source terminal and the P-channel MOS transistor or between the ground point and the N-channel MOS transistor.

Since an expensive NDR element is not utilized, the fourth example has an advantage that the system according to the embodiment can be actualized at low cost. In addition, since a flow-through current is not generated, power consumption can be suppressed compared to the third example.

(6) Other

In the above example, multi-leveled data having four potential levels is generated mainly at the common conductor. Naturally, it is also possible that multi-leveled data having four or more potential levels is generated at the common conductor.

Further, the above description is given for a case of three chips. Naturally, the three-dimensional semiconductor circuit may be constituted with more chips.

(7) Examples of Other Transmitting Circuit

For converting a plurality of binary data into single multi-leveled data, it is also possible to perform multi-leveling by varying a level of a current flowing through a transistor.

Similarly to the case of multi-leveling with potential levels, a three-dimensional semiconductor integrated circuit is structured as illustrated in FIG. 1 or FIG. 2. In the following, description will be given of a transmitting circuit.

FIG. 18 illustrates a first example of the transmitting circuit.

A transmitting circuit 15 is constituted with inverter P1, N1 to which the binary data A is input. The inverter P1, N1 perform one of an operation to charge a common conductor 14 (18 to 21) with a first current and to discharge the common conductor 14 (18 to 21) with a second current as being based on a value of the binary data A.

A transmitting circuit 16 is constituted with inverter P2, N2 to which the binary data B is input. The inverter P2, N2 perform one of an operation to charge a common conductor 14 (18 to 21) with a third current and to discharge the common conductor 14 (18 to 21) with a fourth current based on a value of the binary data B.

Regarding the transmitting circuits 15, 16 of the embodiment, values of the first and fourth current are different from each other and the values of the second and third current are different from each other. Here, a magnitude relation of the values of the fourth current against the first current and that of the values of the third current against the second current are described on the condition that each current is oriented in the same direction.

The values of the first to the fourth current can be varied by mutually differentiating sizes (i.e., channel length and channel width) and threshold values of P-channel MOS transistors P1, P2 and sizes (i.e., channel length and channel width) and threshold values of N-channel MOS transistors N1, N2.

In this case, since multi-leveling is performed with levels of a current capable of being flowed through the respective transistors, it is possible that values of high potential V1 and high potential V3 are set to be the same and values of low potential V2 and low potential V4 are set to be the same.

The above operation will be described.

For example, when a drain current of the MOS transistor P1 is denoted by IdP1, a drain current of the MOS transistor P2 is denoted by IdP2, a drain current of the MOS transistor N1 is denoted by IdN1, and a drain current of the MOS transistor N2 is denoted by IdN2, "|IdP1|>|IdN2|" and "|IdN1|>|IdP2|" are to be satisfied.

Here, when the binary data A is "1" and the binary data B is "1", both of the N-channel transistors N1, N2 are ON. Accordingly, the common conductor 14 (18 to 21) is discharged by both of the N-channel MOS transistors, so that a voltage level appearing thereat is to be the first level (i.e., the minimum value).

Further, when the binary data A is "1" and the binary data B is "0", the N-channel MOS transistor N1 is ON and the P-channel MOS transistor P2 is ON. Here, since a capacity to discharge the common conductor 14 (18 to 21) by the MOS transistor N1 exceeds a capacity to charge the common conductor 14 (18 to 21) by the MOS transistor P2, the voltage level appearing at the common conductor 14 (18 to 21) is to be the second level.

Further, when the binary data A is "0" and the binary data B is "1", the P-channel MOS transistor P1 is ON and the N-channel MOS transistor N2 is ON. Here, since a capacity to charge the common conductor 14 (18 to 21) by the MOS transistor P1 exceeds a capacity to discharge the common conductor 14 (18 to 21) by the MOS transistor N2, the voltage level appearing at the common conductor 14 (18 to 21) is to be the third level.

Furthermore, when the binary data A is "0" and the binary data B is "0", both of the P-channel transistors P1, P2 are ON. Accordingly, the common conductor 14 (18 to 21) is charged by both of the P-channel MOS transistors, so that the voltage level appearing thereat is to be the fourth level (i.e., the maximum value).

The receiving circuit 17 has a function to decode the multi-leveled data (i.e., four-leveled data) appearing as four current levels at the common conductor 14 (18 to 21) with the transmitting circuits 15, 16 to binary data A, B.

In the case of performing multi-leveling with the above example of the transmitting circuit, a flow-through current occurs when the binary data A, B are different. Accordingly, since capacitors which are required for multi-leveling with voltage levels can be eliminated, there is an advantage that the circuit area required for the present system can be lessened. In addition, since a current flows only when the binary data A, B are different and the flowing current is determined by the transistor operated at a low current level, power consumption is not very large.

The above example is described in the case of generating the multi-leveled data (i.e., the four-leveled data) X having four current levels. However, naturally, it is also possible to generate multi-leveled data having four or more current levels (e.g., eight-leveled data, sixteen-leveled data, thirty-two-leveled data, and the like).

Further, the number of chips is not restricted either. Naturally, it is also possible that the three-dimensional semiconductor integrated circuit is structured by three or more chips.

Figure 19:
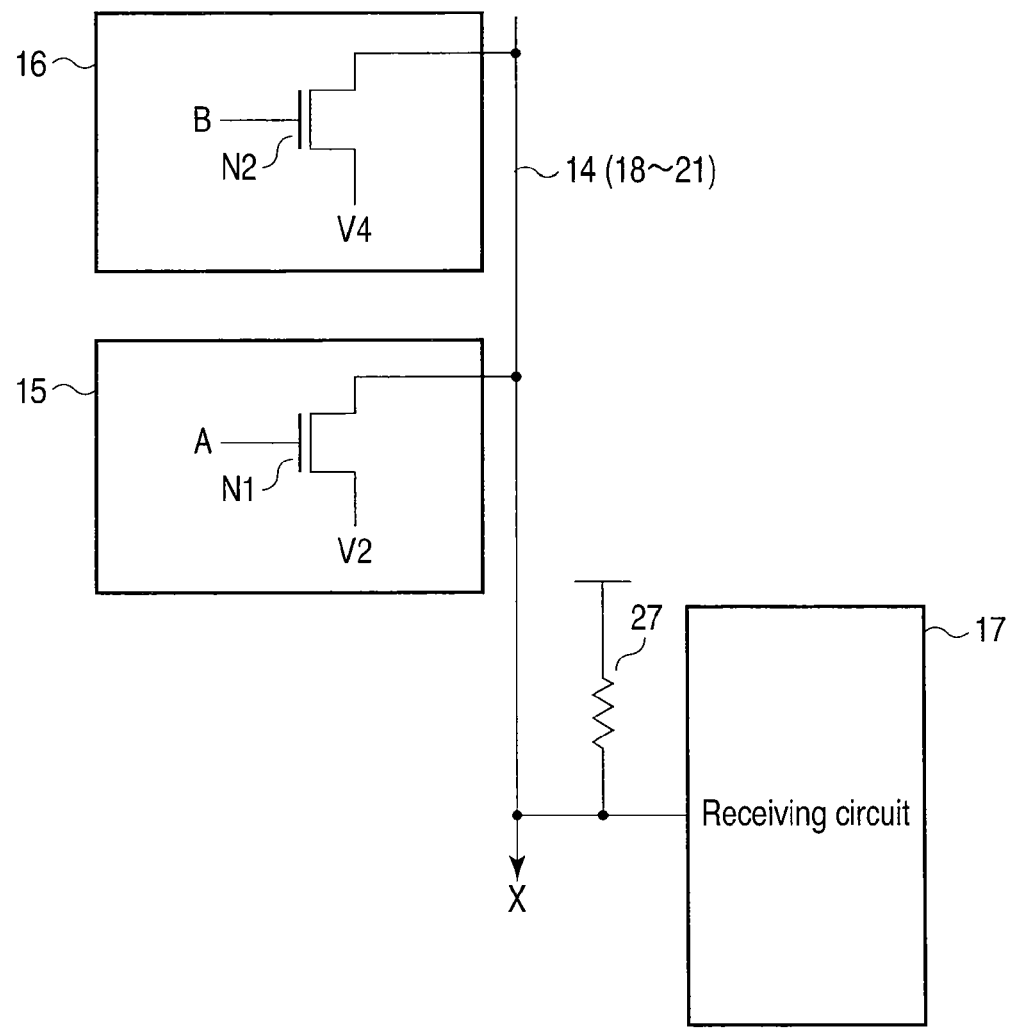

FIG. 19 illustrates a second example of the transmitting circuit.

A transmitting circuit 15 is constituted with an N-channel MOS transistor N1 to which the binary data A is input. The N-channel MOS transistor N1 performs an operation to discharge a common conductor 14 (18 to 21) with a first current based on a value of the binary data A.

A transmitting circuit 16 is constituted with an N-channel MOS transistor N2 to which the binary data B is input. The N-channel MOS transistor N2 performs an operation to discharge the common conductor 14 (18 to 21) with a second current based on a value of the binary data B.

Regarding the transmitting circuits 15, 16 of the embodiment, values of the first and second current are different from each other.

The values of the first and second current can be varied by mutually differentiating sizes (i.e., channel length and channel width) and threshold values of the N-channel MOS transistors N1, N2.

In this case, it is possible that values of low potential V2 and low potential V4 are set to be the same.

Operation of the above will be described.

For example, it is assumed to satisfy "IdN1>IdN2" as a drain current of the MOS transistor N1 is denoted by IdN1 and a drain current of the MOS transistor N2 is denoted by IdN2.

Here, when the binary data A is "1" and the binary data B is "1", both of the N-channel transistors N1, N2 are ON. Accordingly, a current X appearing at the common conductor 14 (18 to 21) is to be "IdN1+IdN2" as the fourth level (i.e., the maximum value).

Further, when the binary data A is "1" and the binary data B is "0", the N-channel MOS transistor N1 is ON and the N-channel MOS transistor N2 is OFF. Accordingly, the current X appearing at the common conductor 14 (18 to 21) is to be IdN1 as the third level.

Further, when the binary data A is "0" and the binary data B is "1", the N-channel MOS transistor N1 is OFF and the N-channel MOS transistor N2 is ON. Accordingly, the current X appearing at the common conductor 14 (18 to 21) is to be IdN2 as the second level.

Furthermore, when the binary data A is "0" and the binary data B is "0", both of the N-channel transistors N1, N2 are OFF. Accordingly, the current X appears little except for a leakage current at the common conductor 14 (18 to 21) as the first level (i.e., the minimum value).

The current flowing through the common conductor 14 (18 to 21) is converted into a voltage with a load resistance 27 which is inserted between a high potential power source and the common conductor 14 (18 to 21).

The receiving circuit 17 has a function to decode the multi-leveled data (i.e., four-leveled data) appearing as four current levels at the common conductor 14 (18 to 21) with the transmitting circuits 15, 16 to binary data A, B.

Here, it is also possible to utilize P-channel MOS transistors as the transistors to flow a current by inserting them between the high potential power source and the common conductor 14 (18 to 21) instead of the N-channel transistors. In this case, a current flows when the binary data A, B are "0". Further, in this case, the load resistance 27 is inserted between the common conductor 14 (18 to 21) and a low potential power source.

When multi-leveling is performed with current levels, a current is generated. However, since the number of necessary transistors can be reduced, there is an advantage that the circuit area required for the present system can be lessened.

The above example described the case of generating the multi-leveled data (i.e., the four-leveled data) X having four current levels. However, naturally, it is also possible to generate multi-leveled data having four or more current levels (e.g., eight-leveled data, sixteen-leveled data, thirty-two-leveled data, and the like).

Further, the number of chips is not restricted either. Naturally, it is also possible that the three-dimensional semiconductor integrated circuit is structured by three or more chips.

3. Bidirectional Multiplex Transmission

The embodiment proposes a technology to transmit a plurality of binary data from semiconductor integrated circuits in a plurality of chips to another chip with a common conductor.

Incidentally, there may be a case that bidirectional data transmission is required for performing data transmission between a plurality of chips. In the following, description is given on a system in which a plurality of binary data from semiconductor integrated circuits in a chip are converted into multi-leveled data and the multi-leveled data is transmitted to a plurality of chips with a common conductor.

When this system is combined with the system of the embodiment, bidirectional multiplex transmission can be performed.

(1) First Structure

FIG. 20 illustrates a three-dimensional semiconductor integrated circuit according to a first structure.

This is the three-dimensional semiconductor integrated circuit in which a common conductor connecting a plurality of chips is a through silicon via.

Three chips (i.e., semiconductor substrates) 11, 12, 13 are vertically stacked against chip surfaces. In this example, description is given for a case that the lowermost chip 11 is the transmitting side and the two chips 12, 13 are the receiving side. However, not limited to the above positional relation among the chips of the receiving side and the transmitting side, it is easily arranged by utilizing a similar technology for the receiving side chip to be placed uppermost or to be sandwiched between the transmitting side chips.

The chip 11 includes transmitting circuits 15, 16.

The transmitting circuit 15 receives binary data A which is to be transferred from the chip 11 to the chips 12, 13 and outputs to a through silicon via 14 as the common conductor after processing the binary data A.

The transmitting circuit 16 receives binary data B which is to be transferred from the chip 11 to the chips 12, 13 and outputs to the through silicon via 14 as the common conductor after processing the binary data B.

The chips 12, 13 respectively include a receiving circuit 17.

The receiving circuit 17 has a function to receive multi-leveled data X appearing at the through silicon via 14 and to decode the multi-leveled data X to the binary data A, B.

Here, sizes of the chips 11, 12, 13 are not specifically restricted.

Although all of the chips 11, 12, 13 are illustrated as having similar size, it is also possible that all the chips thereof are formed differently in size from one another. Alternatively, it is also possible that the chips 12, 13 are formed similarly in size and that the chip 11 is formed larger than the chips 12, 13.

Further, types (i.e., functions) of the chips 11, 12, 13 are not specifically restricted as well.

For example, when the chip 11 is to be a logic chip (e.g., a CPU) having a control circuit and the chips 12, 13 are to be memory chips (e.g., flash memory chips) controlled by the control circuit in the chip 11, a three-dimensional memory system having a large memory capacity can be structured.

(2) Second Structure

FIG. 21 illustrates a three-dimensional semiconductor integrated circuit according to a second structure.

This is the three-dimensional semiconductor integrated circuit in which a common conductor connecting a plurality of chips is bonding wire.

Three chips (i.e., semiconductor substrates) 11, 12, 13 are vertically stacked against chip surfaces. In this example, description is given for a case that the lowermost chip 11 is the transmitting side and the two chips 12, 13 are the receiving side. However, not limited to the above positional relation among the chips of the receiving side and the transmitting side, it is easily arranged by utilizing a similar technology for the transmitting side chip to be placed uppermost or to be sandwiched between the receiving side chips.

The chip 11 includes transmitting circuits 15, 16.

The transmitting circuit 15 receives binary data A which is to be transferred from the chip 11 to the chips 12, 13 and outputs to a bonding wire 20 and a pad 21 as the common conductor after processing the binary data A.

The transmitting circuit 16 receives binary data B which is to be transferred from the chip 11 to the chips 12, 13 and outputs to the bonding wire 20 and the pad 21 as the common conductor after processing the binary data B.

The chips 12, 13 respectively include a receiving circuit 17.

The receiving circuit 17 has a function to receive multi-leveled data X appearing at bonding wires 18, 19 and to decode the multi-leveled data X to the binary data A, B.

Here, sizes of the chips 11, 12, 13 are not specifically restricted.

Although all of the chips 11, 12, 13 are illustrated as having similar size, it is also possible that all chips thereof are formed differently in size from one another. Alternatively, it is also possible that the chips 12, 13 are formed similarly in size and that the chip 11 is formed larger than the chips 12, 13.

Further, types (i.e., functions) of the chips 11, 12, 13 are not specifically restricted either.

For example, when the chip 11 is to be a logic chip (e.g., a CPU) having a control circuit and the chips 12, 13 are to be memory chips (e.g., flash memory chips) controlled by the control circuit in the chip 11, a three-dimensional memory system having a large memory capacity can be structured.

(3) Transmitting Circuit and Receiving Circuit

Regarding the transmitting circuit, it is possible to adopt the transmitting circuit described in the above cases of multi-leveling with potential levels and multi-leveling with current levels. Further, the receiving circuit can be constituted with a circuit (e.g., as illustrated in FIGS. 7, 15, 16 or the like) which has a function to decode a plurality of potential levels or a plurality of current levels to binary data.

4. Buffer

In the embodiment, there may be a case that signal strength is decreased when transmission distance of multi-leveled data is long at a common conductor.

In such a case, it is also possible to connect a buffer to the common conductor.

Figure 22:
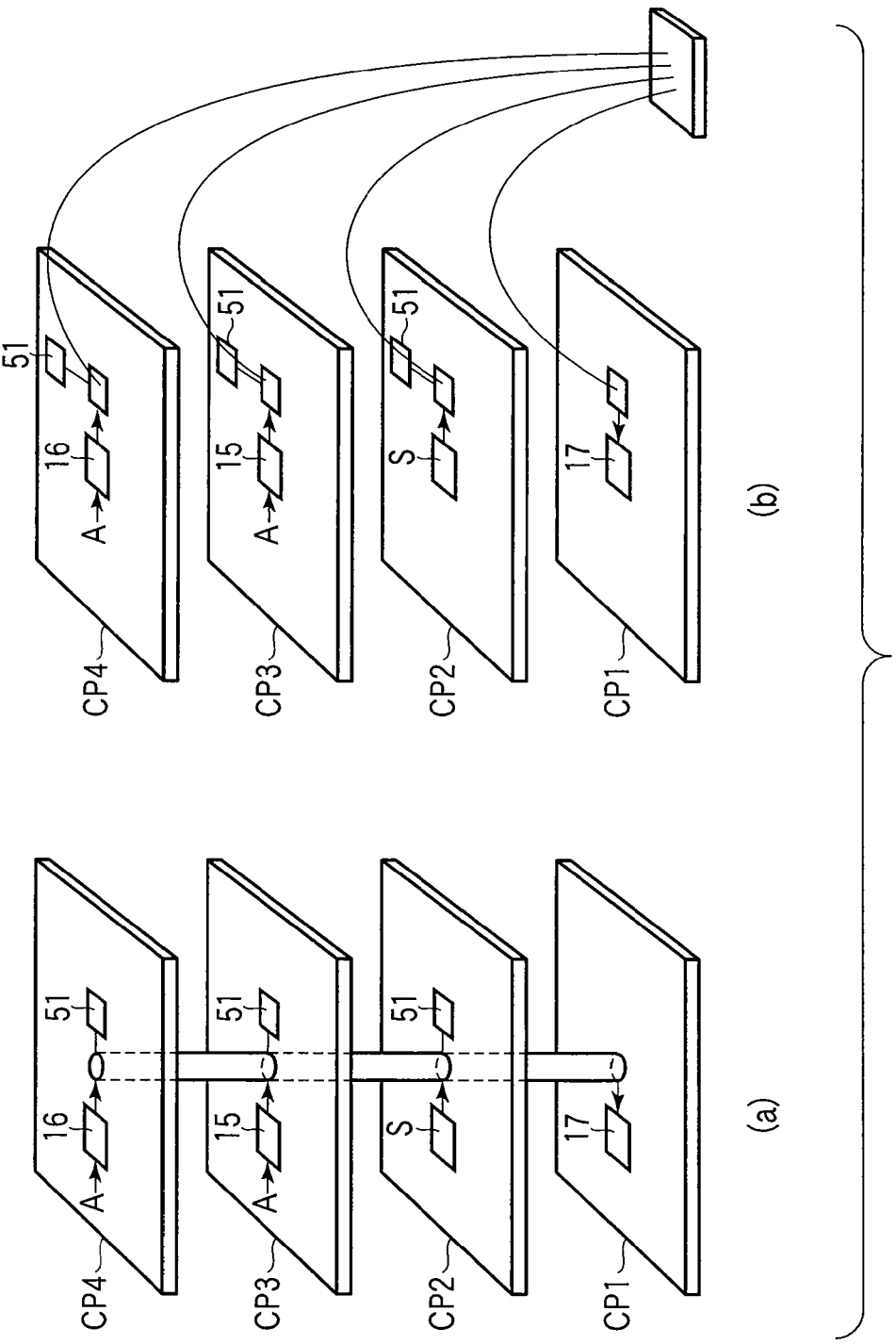
FIG. 22 is a view illustrating a system having a buffer.

For example, in the case that a chip CP1 is a logic chip having a control circuit and chips CP2 to CP4 are memory chips to be controlled by the control circuit of the chip CP1, the transmitting circuit 15, 16, S and a buffer 51 are added respectively to the chips CP2 to CP4, as illustrated in FIG. 22.

Then, when data is transferred from the chips CP3, CP4 to the chip CP1, the buffer 51 of the chip CP2 between the chip CP1 and the chips CP3, CP4 is activated and multi-leveled data appearing at the common conductor 14 (18 to 21) is amplified.

With this structure, the signal strength is not decreased even when the transmission distance of multi-leveled data is long at the common conductor.

Here, the buffer 51 may be constituted with a unity gain buffer utilizing an operational amplifier as illustrated in FIG. 23 or an amplifier of which gain is in the order of "−1" as illustrated in FIG. 24. In the case of using the amplifier of FIG. 24, it is required to ensure that a signal level (i.e., logic) is inverted.

5. Modified Examples

The three-dimensional semiconductor integrated circuit including the transmitting circuit illustrated in FIG. 3-5 of the embodiment essentially requires capacitors. Here, there is a possibility that the capacitors have negative effects on an internal circuit formed on a semiconductor substrate while requiring a large area. In addition, a process to form the capacitors is separately required, which increases a manufacturing cost.

In the following, description will be given on a technology to actualize suppressing of an area overhead, preventing negative effects on an internal circuit, and reducing the manufacturing cost by forming a capacitor between a through silicon via of a chip of one side and an electrode of a chip of the other side of two chips in a three-dimensional semiconductor integrated circuit having a through silicon via.

(1) First Modified Example

FIG. 25 illustrates a structure of a first modified example.

In the first modified example, data is transferred from a chip CP1 at the lower side to a chip CP2 at the upper side of the two stacked chips CP1, CP2.

The chips CP1, CP2 are stacked to have the same orientation.

The chip CP1 is constituted with a semiconductor substrate 52, transmitting circuits 71, 72 formed on the semiconductor substrate 52, insulating layers 53, 54 on the semiconductor substrate 52 to cover the transmitting circuits 71, 72, and electrodes E1, E2 on the insulating layer 54.

The chip CP2 is constituted with a semiconductor substrate 52, a receiving circuit 73 formed on the semiconductor substrate 52, insulating layers 53, 54 on the semiconductor substrate 52 to cover the receiving circuit 73, and a through silicon via 14 penetrating the semiconductor substrate 52.

An insulating layer (i.e., insulating material such as oxide silicon and silicon nitride) 55 is filled between the chips CP1 and CP2.

It is preferable for the insulating layer 55 to be made of a material having a high-dielectric constant, that is, a so-called High-k material. Further, it is preferable for the insulating material 55 to have a function as an adhesive to stick the chips CP1, CP2.

Further, as illustrated in FIG. 26, it is also possible to separately dispose the insulating layer 55 as an interelectrode dielectric and an adhesive 56. The interelectrode dielectric has a higher dielectric constant than that of the insulating layers 53, 54. The adhesive 56 is formed of an organic material, for example.

Further, it is also possible to dispose an air layer between the chips CP1 and CP2 instead of the insulating layer 55.

The through silicon via 14 of the chip CP2 is arranged right above the electrodes E1, E2 of the chip CP1. Further, the insulating layer 55 is arranged between the through silicon via of the chip CP2 and the electrodes E1, E2 of the chip CP1. That is, the two chips CP1, CP2 are electrically connected through capacitors C1, C2.

Values of electrostatic capacitances of the capacitors C1, C2 are different from each other.

Here, since the through silicon via 14 is formed to have a sufficient size (i.e., the size in the direction perpendicular to the stacking direction of the chips CP1, CP2) for forming the capacitors C1, C2, an area overhead does not occur even through the capacitors C1, C2 are mandatory.

FIG. 27 is a view illustrating a principle of signal transfer.

Data A is binary data transmitted from the transmitting circuit 71 of FIG. 25 or FIG. 26 and data B is binary data transmitted from the transmitting circuit 72 of FIG. 25 or FIG. 26.

The through silicon via 14 of FIG. 25 or FIG. 26 is denoted by TSV(14). A capacity of the capacitor C1 is assumed to be C and a capacity of the capacitor C2 is assumed to be 2C.

Here, multi-leveled data (i.e., four-leveled data) X indicated by four potential levels is generated at the through silicon via TSV(14).

The above is specifically indicated in Table 2.

TABLE 2

| Binary data | | Potential of TSV |
|---|---|---|
| A | B | X |
| 0 | 0 | 0 |
| 1 | 0 | CV |
| 0 | 1 | 2CV |
| 1 | 1 | 3CV |

First, initialization is performed to set the through silicon via TSV(14) at 0 V by utilizing an N-channel MOS transistor for pull-down (not illustrated).

Here, when both of the binary data A, B are "0", the potential X of the through silicon via TSV(14) remains at 0 V.

When the binary data A is "1" and the binary data B is "0", the potential X of the through silicon via TSV(14) is C V.

When the binary data A is "0" and the binary data B is "1", the potential X of the through silicon via TSV(14) is 2C V.

When both of the binary data A, B are "1", the potential X of the through silicon via TSV(14) is 3C V.

In this manner, mutually different potentials (i.e., the multi-leveled data X) appear at the through silicon via TSV(14) corresponding to values of the binary data A, B. Further, the receiving circuit 73 of the chip C2 of FIG. 25 or FIG. 26 has a function to decode the multi-leveled data to the binary data A, B.

Accordingly, with the first modified example, it is possible to actualize suppressing of area overhead, prevention of negative effects on an internal circuit, and reduction in manufacturing cost in multiplex transmission utilizing a through silicon via.

In the above first modified example, the two binary data A, B is to be four-leveled data X. Here, it is also possible, based on the same principle, to generate $2^N$-leveled data (here, N is a positive integer larger than 2) at a through silicon via from N pieces of binary data.

In the above, the N pieces of binary data are connected to the through silicon via respectively through N different capacitors. It is preferable for electrostatic capacitances of the N capacitors to be C, 2C, 4C, 8C, . . . , for example.

(2) Second Modified Example

FIG. 28 illustrates a structure of a second modified example.

In the second modified example, data is transferred from a chip CP2 at the upper side to a chip CP1 at the lower side of the two stacked chips CP1, CP2.

The chips CP1, CP2 are stacked to have the same orientation.

The chip CP1 is constituted with a semiconductor substrate 52, a receiving circuit 73 formed on the semiconductor substrate 52, insulating layers 53, 54 on the semiconductor substrate 52 to cover the receiving circuit 73, and an electrode (i.e., a terminal) 57 on the insulating layer 54 connected to the receiving circuit 73.

The chip CP2 is constituted with a semiconductor 52, transmitting circuits 71, 72 formed on the semiconductor substrate 52, insulating layers 53, 54 on the semiconductor substrate 52 to cover the transmitting circuits 71, 72, electrodes E1, E2 on the insulating layer 54, and a through silicon via 14 penetrating the semiconductor substrate 52.

The electrode (i.e., the terminal) 57 of the chip CP1 and the through silicon via 14 of the chip CP2 are electrically connected through a microbump 58. Further, an adhesive (e.g., organic material) 56 is filled between the chips CP1 and CP2.

At the chip CP2, the electrodes E1, E2 are arranged on the through silicon via 14 by the intermediary of an insulating layer (e.g., insulating material such as a High-k material, oxide silicon and silicon nitride) 55. It is preferable for the insulating layer 55 to have a higher dielectric constant than that of the insulating layers 53, 54.

Then, the two chips CP1, CP2 are electrically connected through capacitors C1, C2 of different electrostatic capacitances.

Here, the electrodes E1, E2 of the chip CP2 are arranged right above the through silicon via 14. Further, the through silicon via 14 is formed to have a sufficient size (i.e., the size in the direction perpendicular to the stacking direction of the chips CP1, CP2) for forming the capacitors C1, C2.

Accordingly, an area overhead does not occur even when the capacitors C1, C2 are mandatory.

Here, since the principle of the signal transfer is the same as the first modified example, the description thereof is skipped.

With the second modified example as well, it is possible to actualize suppression of an area overhead, prevention of negative effects on an internal circuit, and reduction in manufacturing cost in multiplex transmission utilizing a through silicon via.

In the above second modified example, the two binary data A, B is to be four-leveled data X. Here, it is also possible, based on the same principle, to generate $2^N$-leveled data (here, N is a positive integer larger than 2) at a through silicon via from N pieces of binary data.

In the above, the N pieces of binary data are connected to the through silicon via respectively through N different capacitors. It is preferable for electrostatic capacitances of the N capacitors to be C, 2C, 4C, 8C, . . . , for example.

In the above, description of the first and second modified examples has been given. Here, bidirectional multiplex transmission can be performed between the two chips CP1, CP2 by combining the both.

(3) Relation Between TSV Size and Dielectric Constant of Interelectrode Insulating Layer FIG. 29 illustrates a relation between a TSV size and a dielectric constant of an interelectrode insulating layer.

FIG. 29 indicates a result of examination of the relation between the size (i.e., the size in the direction perpendicular to the stacking direction of the chips) of the through silicon via 14 required for forming the capacitors C1, C2 of FIGS. 25, 26 and 28 and the dielectric constant of the interelectrode insulating layer.

The horizontal axis denotes the dielectric constant of the interelectrode insulating layer and the vertical axis denotes the size of the through silicon via.

Here, the through silicon via 14 is formed cylindrical and the electrodes E1, E2 are spread in the lower face (or the upper face) of the through silicon via 14. Further, the area ratio between the electrode E1 and the electrode E2 is set to be 1:2. Both of the distances between the through silicon via 14 and the respective electrodes E1, E2 are 0.5 μm.

FIG. 29 illustrates the relation between the minimum possible diameter of the through silicon via 14 and the dielectric constant of the interelectrode insulating layer under the above conditions.

Actually, it is required to consider margins based on alignment accuracy among the through silicon via 14 and the electrodes E1, E2. Accordingly, the through silicon via 14 is required to be sized larger than the above result to some degree.

First, the ratio between an electrostatic capacitance of the electrode E1 and an electrostatic capacitance of the electrode E2 is to be C:2C as becoming equal to the area ratio therebetween. Here, in order to actualize "C=1f F" and "C=2f F" respectively, the relation between the size of the through silicon via 14 and the dielectric constant of the interelectrode insulating layer becomes as follows.

That is, for actualizing "C=1f F", the minimum possible diameter of the through silicon via 14 is on the order of 5 μm when the dielectric constant of the interelectrode insulating layer is on the order of 10.

Further, for actualizing "C=2f F", the minimum possible diameter of the through silicon via 14 is on the order of 7 μm when the dielectric constant of the interelectrode insulating layer is on the order of 10.

From the above result, it is acknowledged that the interelectrode insulating layer is preferably formed of a material of a dielectric constant of 10 or larger for actualizing the through silicon via 14.

(4) Regarding Area Overhead

According to the embodiment, the function to convert binary data to multi-leveled data can be actualized without having an area overhead. However, since a receiving circuit to decode multi-leveled data to binary data is required, an area overhead due to the above occurs.

Figure 30:
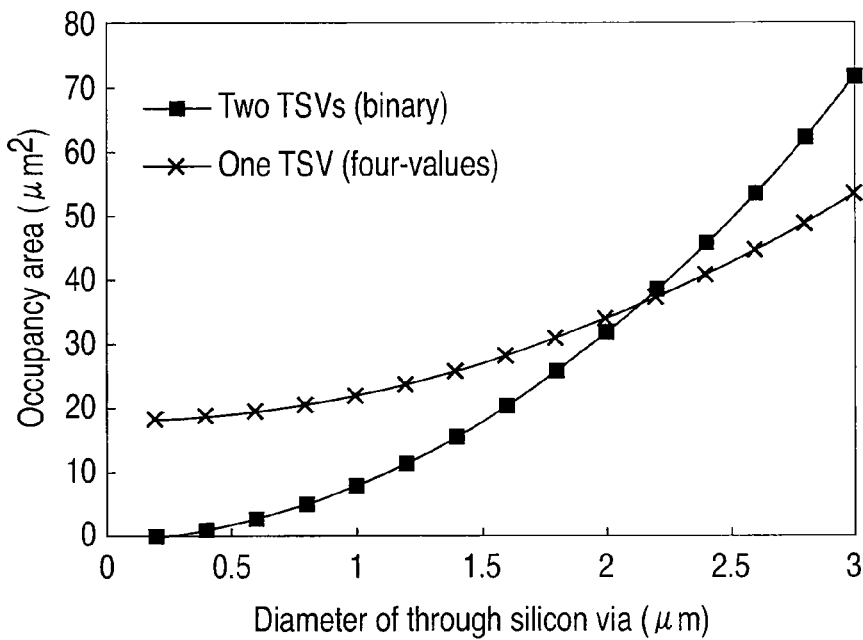
FIG. 30 is a view of comparison between an area required for a four-leveled via and area required for binary via.

FIG. 30 illustrates a result of study on the area overhead.

"One TSV (four-values)" indicates an occupancy area required for forming one through silicon via and a receiving circuit on a chip in the case that the receiving circuit to decode four-leveled data to binary data is actualized with a 65 nm process.

Further, "Two TSV (binary)" indicates an occupancy area required for forming two through silicon vias on a chip in the case that data transfer is performed as remaining as binary data.

Here, the occupancy area is determined on the assumption that the through silicon via requires a margin as the same range as the diameter thereof. Leastwise, since the margin is determined in proportion to a minimum processing dimension of the through silicon via, there is little difference in the characteristics of curves.

The above result reveals that performing data transfer as multi-leveled data by utilizing the embodiment is more advantageous, in terms of area, than performing data transfer as being remained as binary data when the diameter of the through silicon via is 2.3 μm or larger.

Further, a through silicon via cannot be reduced with a processing technology (i.e., the minimum processing dimension) in some cases, while the occupancy area of the receiving circuit utilized in the embodiment can be reduced in accordance with progress of the processing technology (i.e., the minimum processing dimension). Accordingly, in consideration of the above, the embodiment is considered to be more effective.

For example, in the example of FIG. 29, it is possible to obtain the effect of the embodiment when the dielectric constant of the interelectrode insulation layer is 10 and the diameter of the through silicon via is 5 μm for actualizing "C=1f F".

Generally, in consideration of manufacturing cost, it is preferable to adopt multi-leveling of the embodiment for a through silicon via than achieving downsizing.

Here, it is also possible that a through silicon via for multi-leveled data transfer and a through silicon via for binary data transfer are mixed without multi-leveling all of the through silicon vias.

Figure 31:
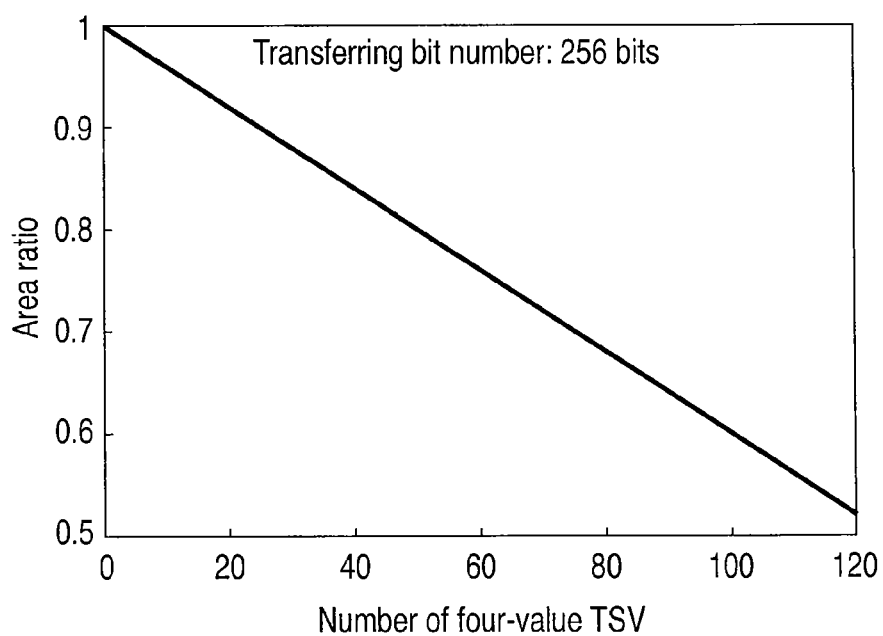
FIG. 31 is a view illustrating an area reduction effect due to a four-leveled via.

FIG. 31 is an example of mixing a through silicon via for four-leveled data transfer and a through silicon via for binary data transfer.

FIG. 31 indicates a ratio of area reduction with increase of the number of through silicon vias for four-leveled data transfer assuming that the area of through silicon vias (e.g., 256) when transferring all of 256-bit data between two chips remaining as binary data is "1".

Here, the diameter of the through silicon vias is 5 μm.

Naturally, the effect of area reduction becomes apparent with increase in the number of through silicon vias for four-leveled data transfer. Further, the effect of area reduction is further increased with increase of data values (e.g., to eight values, sixteen values, to be transferred by one through silicon via.

Here, the number of data values to be transferred by a through silicon via is determined in consideration of increase of power consumption of a receiving circuit which converts multi-leveled data into binary data, and the like.

6. Application Examples

Application examples of the embodiment will be described taking a through silicon, via as an example.

FIG. 32 illustrates a first example of the three-dimensional semiconductor integrated circuit.

Chips L1, M1, M2, 62 respectively having a different function are mounted on a package substrate 60. BGA terminals 61, for example, are arranged at the lower face of the package substrate 60.

The chip L1 is a logic chip (e.g., a CPU). The logic chip L1 includes a receiving circuit 17. Further, the logic chip L1 is connected to a conductive line CL on the package substrate 60 with a bonding wire 65.

The chips M1, M2 are memory chips. The memory chip M1 is stacked on the logic chip L1 and the memory chip M2 is stacked on the memory chip M1.

The chip 62 is a VRM chip. The VRM chip 62 is stacked on the memory chip M2.

Further, bumps 63 are arranged respectively between the logic chip L1 and the memory chip M1, between the memory chip M1 and the memory chip M2, and between the memory chip M2 and the VRM chip 62.

The memory chip M1 includes a transmitting circuit 15 and a through silicon via 14. The memory chip M2 includes a transmitting circuit 16 and a through silicon via 14.

Here, the VRM chip 62 is flip-chip bonded to the memory chip M2 (i.e., a flip-chip structure) as facing one face side thereof downward on which a semiconductor integrated circuit EL is formed.

In contrast, regarding the memory chips M1, M2, one face side having the transmitting circuit 15, 16 is faced upward (i.e., toward the VRM chip 62 side). However, alternatively, it is also possible that the one face side is faced downward (i.e., toward the logic chip L1 side).

FIG. 33 illustrates a second example of the three-dimensional semiconductor integrated circuit.

Chips L1, M1, M2, 62 respectively having a different function are mounted on a package substrate 60. BGA terminals 61, for example, are arranged at the lower face of the package substrate 60.

The chip L1 is a logic chip (e.g., a CPU). The logic chip L1 includes a receiving circuit 17. Further, the logic chip L1 is provided with a through silicon via 14 and is connected to a conductive line CL on the package substrate 60 through the through silicon via 14.

The chips M1, M2 are memory chips. The memory chip M1 is stacked on the logic chip L1 and the memory chip M2 is stacked on the memory chip M1.

The chip 62 is a VRM chip. The VRM chip 62 is stacked on the memory chip M2.

Further, bumps 63 are arranged respectively between the logic chip L1 and the memory chip M1, between the memory chip M1 and the memory chip M2, and between the memory chip M2 and the VRM chip 62.

The memory chip M1 includes a transmitting circuit 15 and a through silicon via 14. The memory chip M2 includes a transmitting circuit 16 and a through silicon via 14.

Here, the VRM chip 62 is flip-chip bonded to the memory chip M2 (i.e., a flip-chip structure) as facing one face side thereof downward on which a semiconductor integrated circuit EL is formed.

In contrast, regarding the memory chips M1, M2, one face side having the transmitting circuit 15, 16 is faced upward (i.e., toward the VRM chip 62 side). However, alternatively, it is also possible that the one face side is faced downward (i.e., toward the logic chip L1 side).

7. Conclusion

A plurality of binary data from semiconductor integrated circuits in a plurality of chips can be formed into multi-leveled data without being collected to one place.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A three-dimensional semiconductor integrated circuit, comprising:
a first chip including a first semiconductor substrate, first and second transmitting circuits which are formed in the first semiconductor substrate, a first insulating layer which is formed on the first semiconductor substrate, a first electrode which is formed on the first insulating layer and is connected to the first transmitting circuit, and a second electrode which is formed on the first insulating layer and is connected to the second transmitting circuit; and
a second chip including a second semiconductor substrate, a receiving circuit which is formed in the second semiconductor substrate, a second insulating layer which is formed on the second semiconductor substrate, and a via which penetrates the second semiconductor substrate and is connected to the receiving circuit, wherein the first and second chips are stacked in the same orientation, the first and second electrodes are arranged right below the via, a first electrostatic capacitance is formed between the via and the first electrode, a second electrostatic capacitance is formed between the via and the second electrode, and values of the first and second capacitances are different from each other.

2. The circuit of claim 1, wherein an interelectrode insulating layer having a higher dielectric constant than respective dielectric constants of the first and second insulating layers is arranged respectively between the via and the first electrode and between the via and the second electrode.

3. The circuit of claim 1, wherein the transmitting circuits have a function to output binary data and the receiving circuit has a function to decode multi-leveled data to binary data.

4. A three-dimensional semiconductor integrated circuit, comprising:

a first chip including a first semiconductor substrate, first and second transmitting circuits which are formed in the first semiconductor substrate, a first insulating layer which is formed on the first semiconductor substrate, a first electrode which is formed on the first insulating layer and is connected to the first transmitting circuit, and a second electrode which is formed on the first insulating layer and is connected to the second transmitting circuit; and a second chip including a second semiconductor substrate, a receiving circuit which is formed in the second semiconductor substrate, a second insulating layer which is formed on the second semiconductor substrate, and a via which penetrates the second semiconductor substrate and is connected to the receiving circuit, wherein the first and second chips are stacked in the same orientation, the first and second electrodes overlap with the via when seeing the first and second electrodes and the via from a direction in which the first and second chips are stacked, a first electrostatic capacitance is formed between the via and the first electrode, a second electrostatic capacitance is formed between the via and the second electrode, and values of the first and second capacitances are different from each other.

5. The circuit of claim 4, wherein an interelectrode insulating layer having a higher dielectric constant than respective dielectric constants of the first and second insulating layers is arranged respectively between the via and the first electrode and between the via and the second electrode.

6. The circuit of claim 4, wherein the transmitting circuits have a function to output binary data and the receiving circuit has a function to decode multi-leveled data to binary data.

7. A three-dimensional semiconductor integrated circuit, comprising:

a first chip including a first semiconductor substrate, first and second transmitting circuits which are formed in the first semiconductor substrate, a first insulating layer which is formed on the first semiconductor substrate, a first electrode which is formed on the first insulating layer and is connected to the first transmitting circuit, and a second electrode which is formed on the first insulating layer and is connected to the second transmitting circuit; and a second chip including a second semiconductor substrate, a receiving circuit which is formed in the second semiconductor substrate, a second insulating layer which is formed on the second semiconductor substrate, and a via which penetrates the second semiconductor substrate and is connected to the receiving circuit, wherein the first and second chips are stacked in the same orientation, the first and second electrodes are insulated from each other, a first electrostatic capacitance is formed between the via and the first electrode, a second electrostatic capacitance is formed between the via and the second electrode, and values of the first and second capacitances are different from each other.

8. The circuit of claim 7, wherein an interelectrode insulating layer having a higher dielectric constant than respective dielectric constants of the first and second insulating layers is arranged respectively between the via and the first electrode and between the via and the second electrode.

9. The circuit of claim 7, wherein the transmitting circuits have a function to output binary data and the receiving circuit has a function to decode multi-leveled data to binary data.

* * * * *